US010916553B2

(12) United States Patent
Sakui

(10) Patent No.: US 10,916,553 B2
(45) Date of Patent: Feb. 9, 2021

(54) 3D VERTICAL NAND MEMORY DEVICE INCLUDING MULTIPLE SELECT LINES AND CONTROL LINES HAVING DIFFERENT VERTICAL SPACING

(71) Applicant: Micron Technology, Inc., Boise, ID (US)

(72) Inventor: Koji Sakui, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/668,959

(22) Filed: Oct. 30, 2019

(65) Prior Publication Data

US 2020/0066736 A1    Feb. 27, 2020

Related U.S. Application Data

(60) Continuation of application No. 16/031,831, filed on Jul. 10, 2018, now Pat. No. 10,468,423, which is a
(Continued)

(51) Int. Cl.
*H01L 27/115* (2017.01)
*G11C 16/08* (2006.01)
(Continued)

(52) U.S. Cl.
CPC ........ *H01L 27/115* (2013.01); *G11C 16/0483* (2013.01); *G11C 16/08* (2013.01);
(Continued)

(58) Field of Classification Search
CPC ......... G11C 16/10; G11C 16/14; G11C 16/26; G11C 16/0483; G11C 16/08;
(Continued)

(56) References Cited

U.S. PATENT DOCUMENTS 6,845,042 B2    1/2005 Ichige et al.
7,141,474 B2   11/2006 Ichige et al.
(Continued)

FOREIGN PATENT DOCUMENTS

CN         107885668 A      4/2018

OTHER PUBLICATIONS

Lee, Do-Hyun, et al., "A new cell-type string select transistor in NAND flash memories for under 20nm node", IEEE, (2012), 3 pgs.

*Primary Examiner* — Ajay Ojha
(74) *Attorney, Agent, or Firm* — Schwegman Lundberg & Woessner, P.A.

(57) ABSTRACT

Some embodiments include apparatuses, and methods of forming and operating the apparatuses. Some of the apparatuses include a pillar including a length, a memory cell string and control lines located along a first segment of the pillar, and select lines located along a second segment of the pillar. The control lines include at least a first control line and a second control line. The first control line is adjacent the second control line. The first control line is separated from the second control line by a first distance in a direction of the length of the pillar. The select lines include at least a first select line and a second select line. The first select line is separated from the second select line by a second distance in the direction of the length of the pillar. The second distance is less than the first distance.

20 Claims, 18 Drawing Sheets

Related U.S. Application Data division of application No. 15/278,405, filed on Sep. 28, 2016, now Pat. No. 10,042,755.

(51) Int. Cl.

| | | |
|---|---|---|
| *H01L 27/11582* | (2017.01) | |
| *G11C 16/04* | (2006.01) | |
| *G11C 16/10* | (2006.01) | |
| *G11C 16/14* | (2006.01) | |
| *G11C 16/26* | (2006.01) | |
| *H01L 27/105* | (2006.01) | |
| *G06F 12/02* | (2006.01) | |

(52) U.S. Cl.
CPC ............ *G11C 16/10* (2013.01); *G11C 16/14* (2013.01); *G11C 16/26* (2013.01); *H01L 27/1052* (2013.01); *H01L 27/11582* (2013.01); *G06F 12/0246* (2013.01)

(58) Field of Classification Search
CPC ............. G06F 12/0246; G06F 12/0646; H01L 27/115; H01L 27/1052; H01L 27/11582
See application file for complete search history.

(56) References Cited

U.S. PATENT DOCUMENTS

| | | |
|---|---|---|
| 7,498,630 B2 | 3/2009 | Ichige et al. |
| 10,042,755 B2 | 8/2018 | Sakui |
| 10,468,423 B2 | 11/2019 | Sakui |
| 2013/0092994 A1* | 4/2013 | Shim ................ H01L 27/11556 257/314 |
| 2014/0198573 A1 | 7/2014 | Jung et al. |
| 2015/0179660 A1* | 6/2015 | Yada ................. H01L 21/02164 257/321 |
| 2016/0011971 A1 | 1/2016 | Lee et al. |
| 2017/0103999 A1 | 4/2017 | Lee et al. |
| 2018/0090208 A1 | 3/2018 | Sakui |
| 2018/0322045 A1 | 11/2018 | Sakui |

\* cited by examiner

700

3D VERTICAL NAND MEMORY DEVICE INCLUDING MULTIPLE SELECT LINES AND CONTROL LINES HAVING DIFFERENT VERTICAL SPACING

PRIORITY APPLICATION

This application is a continuation of U.S. application Ser. No. 16/031,831, filed Jul. 10, 2018, which is a divisional of U.S. application Ser. No. 15/278,405, filed Sep. 28, 2016, now issued as U.S. Pat. No. 10,042,755, all of which are incorporated herein by reference in their entirety.

BACKGROUND

Memory devices are widely used in computers and many other electronic items to store information. A memory device usually has numerous memory cells. The memory device performs a write operation to store information in the memory cells, a read operation to read the stored information, and an erase operation to erase information (e.g., obsolete information) from some or all of the memory cells. Memory devices also have other components (e.g., control lines and select lines) to access the memory cells during read, write, and erase operations. The structures of such components can affect the performance of the memory device. As described in more details below, the described memory devices include structures that allow them to have improvements over some conventional memory devices.

DETAILED DESCRIPTION

Figure 1:
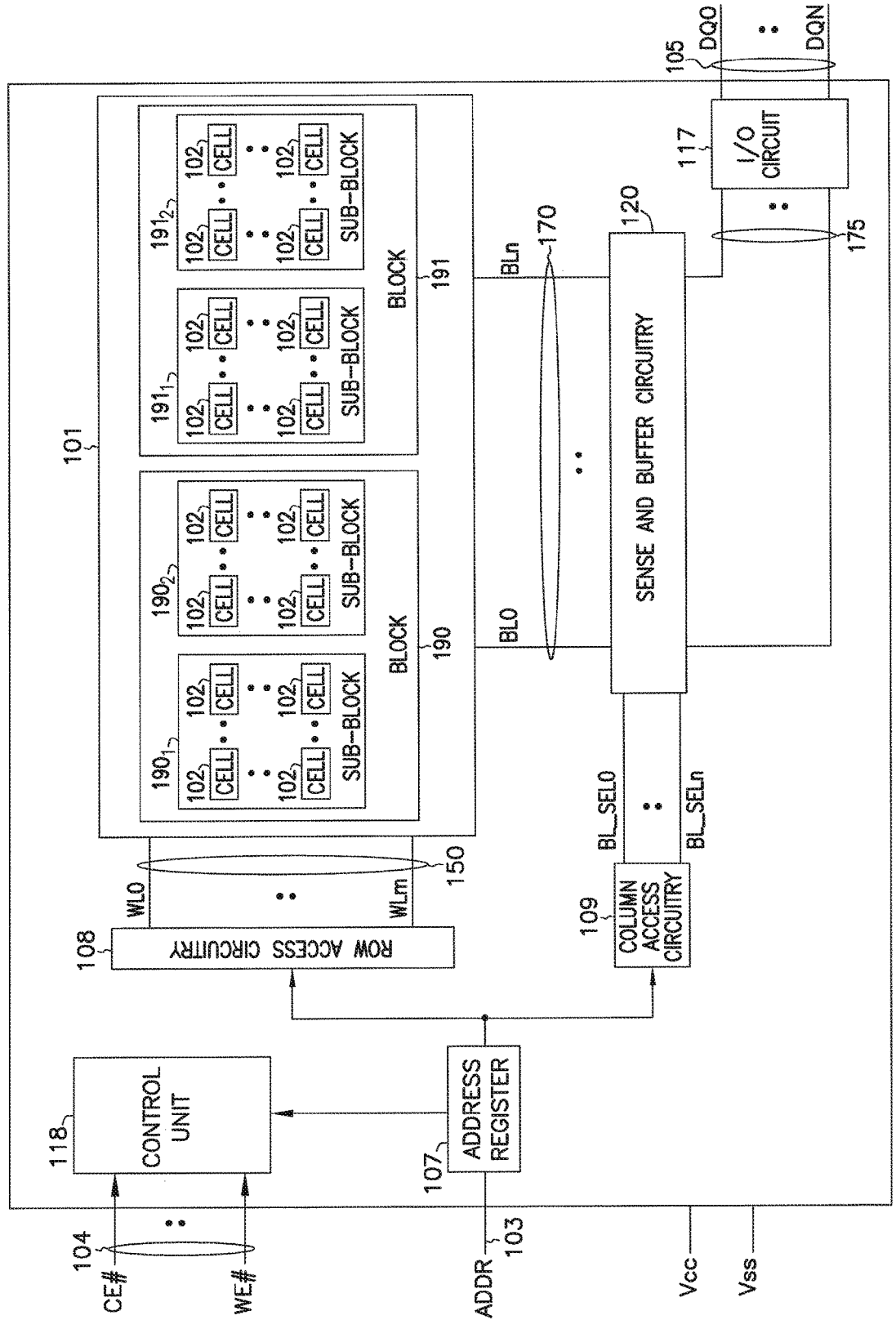
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks 190 and 191. Each of blocks 190 and 191 can include sub-blocks. For example, block 190 can include sub-blocks $190_1$ and $190_2$. Block 191 can include sub-blocks $191_1$ and $191_2$, In the physical structure of memory device 100, memory cells 102 can be arranged vertically (e.g., stacked over each other) over a substrate (e.g., a semiconductor substrate) of memory device 100. FIG. 1 shows memory device 100 having two blocks 190 and 191 and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks 190 and 191 and data lines 170 to selectively exchange information (e.g., data) with memory cells 102 of blocks 190 and 191.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks 190 and 191 are to be accessed during a memory operation. Memory device 100 can perform a read operation to read (e.g., sense) information (e.g., previously stored information) in memory cells 102 of blocks 190 and 191, or a write (e.g., programming) operation to store (e.g., program) information in memory cells 102 of blocks 190 and 191. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks 190 and 191.

Memory device 100 can include a control unit 118 that can be configured to control memory operations of memory device 100 based on control signals on lines 104. Examples of the control signals on lines 104 include one or more clock signals and other signals (e.g., a chip enable signal CE#, a write enable signal WE#) to indicate which operation (e.g., read, write, or erase operation) memory device 100 can perform.

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks 190 and 191 and provide the value of the information to lines (e.g., global data lines) 175. Sense and buffer circuitry 120 can also can be configured to use signals on lines 175 to determine the value of information to be stored (e.g., programmed) in memory cells 102 of blocks 190 and 191 (e.g., during a write operation) based on the values (e.g., voltage values) of signals on lines 175 (e.g., during a write operation).

Memory device 100 can include input/output (I/O) circuitry 117 to exchange information between memory cells 102 of blocks 190 and 191 and lines (e.g., I/O lines) 105. Signals DQ0 through DQN on lines 105 can represent information read from or stored in memory cells 102 of blocks 190 and 191. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of a fraction of a bit, a value of a single bit, or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00" "01" "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 15.

Figure 2:
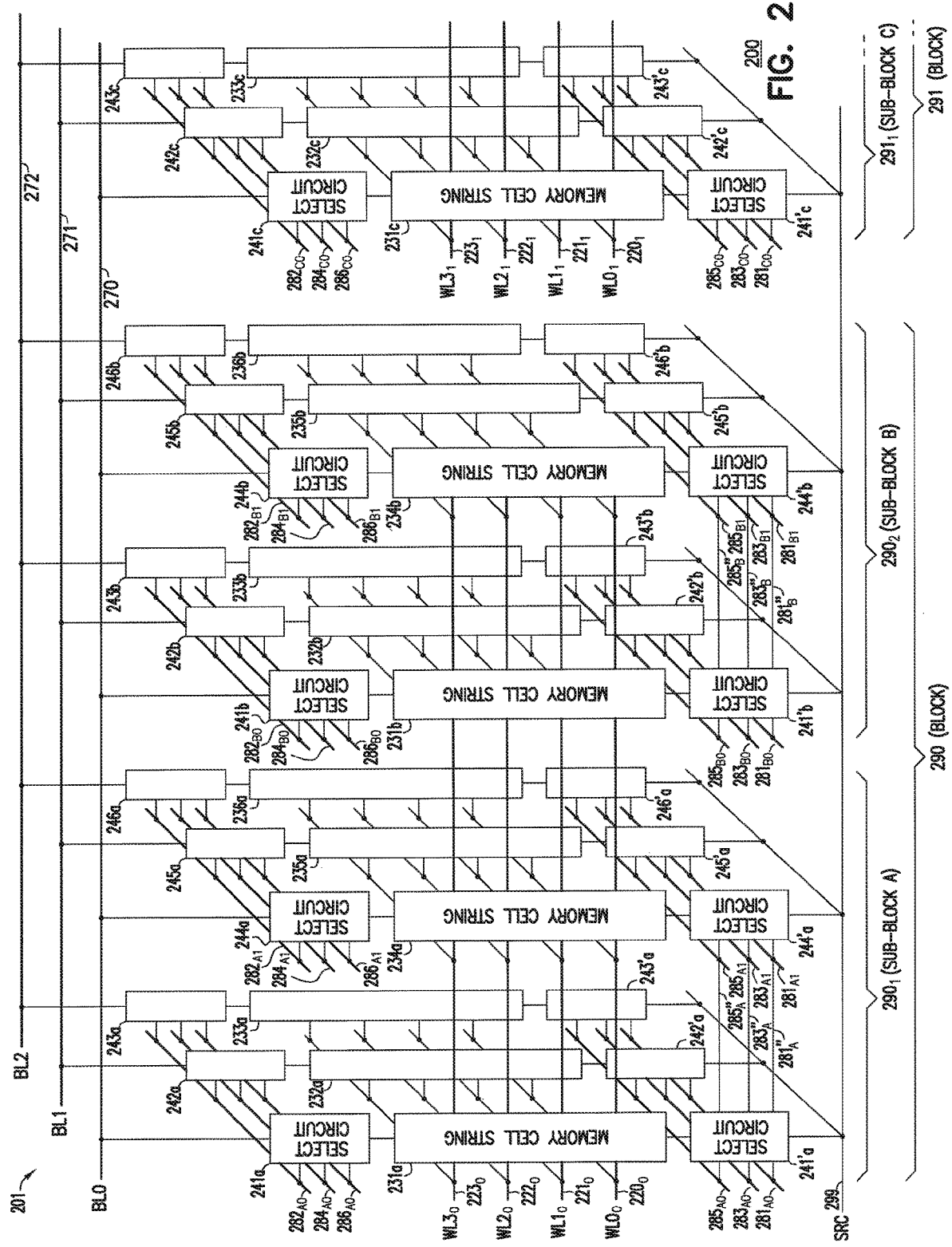
FIG. 2 shows a block diagram of a portion of a memory device including a memory array having memory cell strings and associated select circuits, according to some embodiments described herein.

FIG. 2 shows a block diagram of a portion of a memory device 200 including a memory array 201 having memory cell strings and associated select circuits, according to some embodiments described herein. Memory device 200 can correspond to memory device 100 of FIG. 1. For example, memory array 201 can form part of memory array 101 of FIG. 1.

As shown in FIG. 2, memory device 200 can include blocks (blocks of memory cells) 290 and 291. Two blocks are shown as an example. Memory device 200 can include many blocks (e.g., up to thousands or more blocks). Each of blocks 290 and 291 can include sub-blocks. For example, block 290 can include sub-blocks $290_1$ and $290_2$. Block 291 can include a sub-block $291_1$ (and one or more additional sub-block, which are not shown). Block 290 and 291 can include the same number of sub-blocks.

Each of sub-blocks $290_1$, $290_2$, and $291_1$ has its own memory cell strings, and each of the memory cell strings can be associated with (e.g., coupled to) select circuits. For example, sub-block $290_1$ has memory cell strings 231a, 232a, 233a, 234a, 235a, and 236a, and associated select circuits (e.g., drain select circuits) 241a, 242a, 243a, 244a, 245a, and 246a, and select circuits (e.g., source select circuits) 241'a, 242'a, 243'a, 244'a, 245'a, and 246'a.

Sub-block $290_2$ has memory cell strings 231b, 232b, 233b, 234b, 235b, and 236b, and associated select circuits (e.g., drain select circuits) 241b, 242b, 243b, 244b, 245b, and 246b, and select circuits (e.g., source select circuits) 241'b, 242'b, 243'b, 244'b, 245'b, and 246'b.

Sub-block $291_1$ has memory cell strings 231c, 232c, and 233c, and associated select circuits (e.g., drain select circuits) 241c, 242c, and 243c, and select circuits (e.g., source select circuits) 241'c, 242'c, and 243'c. The sub-blocks of the blocks (e.g., blocks 290 and 291) of memory device 200 can have the same number of memory cell strings and associated select circuits.

FIG. 2 shows an example of six memory cell strings and their associated circuits in a sub-block (e.g., in sub-block $290_1$). The number of memory cell strings and their associated select circuits in each the sub-block of blocks 290 and 291 can vary.

Memory device 200 can include data lines 270, 271, and 272 that carry signals BL0, BL1, and BL2, respectively. Each of data lines 270, 271, and 272 can be structured as a conductive line (which includes conductive materials). The memory cell strings of blocks 290 and 291 can share data lines 270, 271, and 272. For example, memory cell strings 231a, 234a, 231b, 234b, and 231c can share data line 270. Memory cell strings 232a, 235a, 232b, 235b, and 232c can share data line 271. Memory cell strings 233a, 236a, 233b, 236b, and 233c can share data line 272. FIG. 2 shows three data lines 270, 271, and 272 as an example. The number of data lines can vary.

Memory device 200 can include a line 299 that can carry a signal SRC (e.g., source line signal). Line 299 can be structured as a conductive line (which includes conductive materials) and can form part of a source (e.g., a source line) of memory device 200. Blocks 290 and 291 can share line 299.

Memory device 200 can include separate control lines in blocks 290 and 291. For example, in block 290, memory device 200 includes control lines $220_0$, $221_0$, $222_0$, and $223_0$ that can carry corresponding signals (e.g., word line signals) $WL0_0$, $WL1_0$, $WL2_0$, and $WL3_0$. In block 291, memory device 200 includes control lines $220_1$, $221_1$, $222_1$, and $223_1$ that can carry corresponding signals (e.g., word line signals) $WL0_1$, $WL1_1$, $WL2_1$, and $WL3_1$. Control lines $220_0$ through $223_0$ and $220_1$ through $223_1$ can be structured as conductive control lines (which include conductive materials) that can form part of respective access lines of memory device 200 to access memory cells in a respective block. FIG. 2 shows four control lines ($220_0$ through $223_0$ or $220_1$ through $223_1$) in each of blocks 290 and 291 as an example. The number of control lines can vary.

As shown in sub-block $290_1$, memory device 200 includes select lines (e.g., drain select lines) $282_{A0}$, $284_{A0}$, and $286_{A0}$ that can be shared by select circuits 241a, 242a, and 243a; select lines (e.g., drain select lines) $282_{A1}$, $284_{A1}$, and $286_{A1}$ that can be shared by select circuits 244a, 245a, and 246a; select lines (e.g., source select lines) $281_{A0}$, $283_{A0}$, and $285_{A0}$ that can be shared by select circuits 241'a, 242'a, and 243'a; and select lines (e.g., source select lines) $281_{A1}$, $283_{A1}$, and $285_{A1}$ that can be shared by select circuits 244'a, 245'a, and 246'a.

In sub-block $290_2$, memory device 200 includes select lines (e.g., drain select lines) $282_{B0}$, $284_{B0}$, and $286_{B0}$ that can be shared by select circuits 241b, 242b, and 243b; select lines (e.g., drain select lines) $282_{B1}$, $284_{B1}$, and $286_{B1}$ that can be shared by select circuits 244b, 245b, and 246b; select lines (e.g., source select lines) $281_{B0}$, $283_{B0}$, and $285_{B0}$ that can be shared by select circuits 241'b, 242'b, and 243'b; and select lines (e.g., source select lines) $281_{B1}$, $283_{B1}$, and $285_{B1}$ that can be shared by select circuits 244'b, 245'b, and 246'b.

In sub-block $291_1$, memory device 200 includes select lines (e.g., drain select lines) $282_{C0}$, $284_{C0}$, and $286_{C0}$ that can be shared by select circuits 241c, 242c, and 243c; and select lines (e.g., source select lines) $281_{C0}$, $283_{C0}$, and $285_{C0}$ that can be shared by select circuits 241'c, 242'c, and 243'c.

FIG. 2 shows an example where memory device 200 includes three drain select lines (e.g., $282_{A0}$, $284_{A0}$, and $286_{A0}$) associated with a drain select circuit (e.g., 241a, 242a, or 243a). However, memory device 200 can include fewer or more than three drain select lines associated with a drain select circuit. Similarly, FIG. 2 shows an example where memory device 200 includes three source select lines (e.g., $281_{A0}$, $283_{A0}$, and $285_{A0}$) associated with a source select circuit (e.g., 241'a, 242'a, or 243'a). However, memory device 200 can include fewer or more than three source select lines associated with a source select circuit.

FIG. 2 shows connections $281''_A$, $283''_A$, and $285''_A$ to indicate an example of memory device 200 where select lines $281_{A0}$ and $281_{A1}$ can be coupled to each other, select lines $283_{A0}$ and $283_{A1}$ can be coupled to each other, and select lines $285_{A0}$ and $285_{A1}$ can be coupled to each other. Thus, in an example of memory device 200, select lines $281_{A0}$ and $281_{A1}$ can be provided with the same signal; select lines $283_{A0}$ and $283_{A1}$ can be provided with the same signal; and select lines $285_{A0}$ and $285_{A1}$ can be provided with the same signal.

Similarly, connections $281''_B$, $283''_B$, and $285''_B$ in FIG. 2 indicate an example of memory device 200 where select lines $281_{B0}$ and $281_{B1}$ can be coupled to each other, select lines $283_{B0}$ and $283_{B1}$ can be coupled to each other, and select lines $285_{B0}$ and $285_{B1}$ can be coupled to each other. Thus, in an example of memory device 200, select lines $281_{B0}$ and $281_{B1}$ can be provided with the same signal; select lines $283_{B0}$ and $283_{B1}$ can be provided with the same signal; and select lines $285_{B0}$ and $285_{B1}$ can be provided with the same signal.

In the structure of memory device 200, each of connections $281''_A$, $283''_A$, and $285''_A$ can be a direct connection. As an example, in a direct connection, select lines $281_{A0}$ and $281_{A1}$ can be part of the same piece of conductive material (e.g., a same layer of conductive material); select lines $283_{A0}$ and $283_{A1}$ can be part of the same piece of conductive material (e.g., a same layer of conductive material); and select lines $285_{A0}$ and $285_{A1}$ can be part of the same piece of conductive material (e.g., a same layer of conductive material). Alternatively, each of connections $281''_A$, $283''_A$, and $285''_A$ can be an indirect connection. For example, in the indirect connection, select lines $281_{A0}$ and $281_{A1}$ may not be formed from the same piece (e.g., layer) of conductive material but they can be coupled (e.g., electrically coupled) to each other through a transistor (or through multiple transistors); select lines $283_{A0}$ and $283_{A1}$ may not be formed from the same piece (e.g., layer) of conductive material but they can be coupled (e.g., electrically couple) to each other through a transistor (or through multiple transistors); and select lines $285_{A0}$ and $285_{A1}$ may not be formed from the same piece (e.g., layer) of conductive material but they can be coupled (e.g., electrically coupled) to each other through a transistor (or through multiple transistors).

Similarly, in the structure of memory device 200, each of connections $281''_B$, $283''_B$, and $285''_B$ can be a direct connection. As an example, in a direct connection, select lines $281_{B0}$ and $281_{B1}$ can be part of the same piece of conductive material (e.g., a same layer of conductive material); select lines $283_{B0}$ and $283_{B1}$ can be part of the same piece of conductive material (e.g., a same layer of conductive material); and select lines $285_{B0}$ and $285_{B1}$ can be part of the same piece of conductive material (e.g., a same layer of conductive material). Alternatively, each of connections $281''_B$, $283''_B$, and $285''_B$ can be an indirect connection. For example, in the indirect connection, select lines $281_{B0}$ and $281_{B1}$ may not be formed from the same piece (e.g., layer) of conductive material but they can be coupled (e.g., electrically coupled) to each other through a transistor (or through multiple transistors); select lines $283_{B0}$ and $283_{B1}$ may not be formed from the same piece (e.g., layer) of conductive material but they can be coupled (e.g., electrically coupled) to each other through a transistor (or through multiple transistors); and select lines $285_{B0}$ and $285_{B1}$ may not be formed from the same piece (e.g., layer) of conductive material but they can be coupled (e.g., electrically coupled) to each other through a transistor (or through multiple transistors).

FIG. 2 shows an example where select lines $282_{A0}$, $284_{A0}$, and $286_{A0}$ are uncoupled from (i.e., independent of) each other; select lines $282_{A1}$, $284_{A1}$, and $286_{A1}$ are uncoupled from each other; select lines $282_{B0}$, $284_{B0}$, and $286_{B0}$ are uncoupled from each other; select lines $282_{B1}$, $284_{B1}$, and $286_{B1}$ are uncoupled from each other; and select lines $282_{C0}$, $284_{C0}$, and $286_{C0}$ are uncoupled from each other. Alternatively, select lines $282_{A0}$, $284_{A0}$, and $286_{A0}$ can be coupled (e.g., directly coupled) to each other; select lines $282_{A1}$, $284_{A1}$, and $286_{A1}$ can be coupled (e.g., directly coupled) to each other; select lines $282_{B0}$, $284_{B0}$, and $286_{B0}$ can be coupled (e.g., directly coupled) to each other; select lines $282_{B1}$, $284_{B1}$, and $286_{B1}$ can be coupled (e.g., directly coupled) to each other; and select lines $282_{C0}$, $284_{C0}$, and $286_{C0}$ can be coupled (e.g., directly coupled) to each other.

Figure 3:
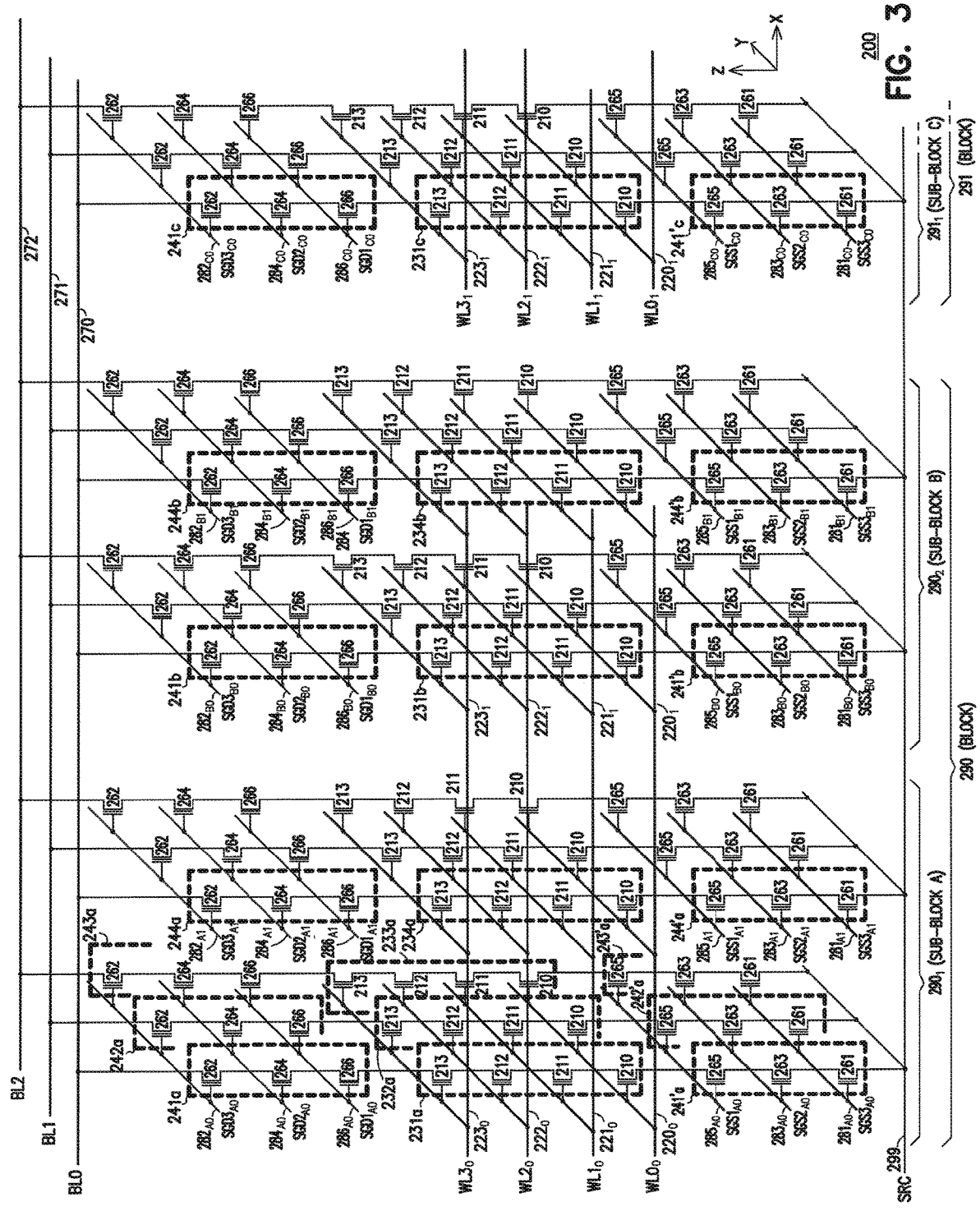
FIG. 3 shows a schematic diagram of the memory device of FIG. 2, according to some embodiments described herein.

Each of the select circuits of memory device 200 can include multiple select gates (e.g., three transistors, shown in FIG. 3). The select gates can be controlled (e.g., turned on or turned off) by the levels (e.g., voltage levels) of the signals on respective select lines.

In FIG. 2, each of the memory cell strings of memory device 200 has memory cells (shown in FIG. 3) arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the transistors in the select circuit (or selected circuits)), depending on which operation memory device 200 performs on the selected memory cell string.

Activating a particular select circuit among the select circuits of memory device 200 during an operation of memory device 200 can include providing (e.g., applying) voltages having certain values to the signals on select lines associated with that particular select circuit. When a particular drain select circuit of memory device 200 is activated, it can couple (e.g., form a current path from) a selected memory cell string associated with that particular select circuit to a respective data line (e.g., one of data lines 270, 271, or 272). When a particular source select circuit is activated, it can couple (e.g., form a current path from) a selected memory cell string associated with that particular select circuit to a source (e.g., line 299).

FIG. 3 shows a schematic diagram of memory device 200 of FIG. 2, according to some embodiments described herein. For simplicity, only some of the memory cell strings and some of the select circuits of memory device 200 of FIG. 2 are labeled in FIG. 3.

As shown in FIG. 3, each select line can carry an associated select signal. For example, in sub-block $290_1$, select lines (e.g., drain select lines) $282_{A0}$, $284_{A0}$, $286_{A0}$, $282_{A1}$, $284_{A1}$, and $286_{A1}$ can carry associated signals $SGD3_{A0}$, $SGD2_{A0}$, $SGD1_{A0}$, $SGD3_{A1}$, $SGD2_{A1}$, and $SGD1_{A1}$, respectively; select lines (e.g., source select lines) $281_{A0}$, $283_{A0}$, $285_{A0}$, $281_{A1}$, $283_{A1}$, and $285_{A1}$ can carry associated signals $SGS3_{A0}$, $SGS2_{A0}$, $SGS1_{A0}$, $SGS3_{A1}$, $SGS2_{A1}$, and $SGS1_{A1}$, respectively. In sub-block $290_2$, select lines (e.g., drain select lines) $282_{B0}$, $284_{B0}$, $286_{B0}$, $282_{B1}$, $284_{B1}$, and $286_{B1}$ can carry associated signals $SGD3_{B0}$, $SGD2_{B0}$, $SGD1_{B0}$, $SGD3_{B1}$, $SGD2_{B1}$, and $SGD1_{B1}$, respectively; select lines (e.g., source select lines) $281_{B0}$, $283_{B0}$, $285_{B0}$, $281_{B1}$, $283_{B1}$, and $285_{B1}$ can carry associated signals $SGS3_{B0}$, $SGS2_{B0}$, $SGS1_{B0}$, $SGS3_{B1}$, $SGS2_{B1}$, and $SGS1_{B1}$, respectively. In sub-block $291_1$, select lines (e.g., drain select lines) $282_{C0}$, $284_{C0}$, and $286_{C0}$ can carry associated signals $SGD3_{C0}$, $SGD2_{C0}$, and $SGD1_{C0}$, respectively; select lines (e.g., source select lines) $281_{C0}$, $283_{C0}$, and $285_{C0}$ can carry associated signals $SGS3_{C0}$, $SGS2_{C0}$, and $SGS1_{C0}$, respectively.

As shown in FIG. 3, memory device 200 can include memory cells 210, 211, 212, and 213; select gates (e.g., drain select gates or transistors) 262, 264, 266; and select gates (e.g., source select gates or transistors) 261, 263, and 265 that can be physically arranged in three dimensions (3-D), such as x, y, and z dimensions (e.g., directions), with respect to the structure (shown in FIG. 6) of memory device 200.

Each of the memory cell strings (e.g., memory cell strings 231a, 232a, 233a, 234a, 231b, 234b, 231c) of memory device 200 can include one of memory cells 210, one of memory cells 211, one of memory cells 212, and one of memory cells 213. FIG. 3 shows an example of four memory cells 210, 211, 212, and 213 in each memory cell string. The number of memory cells in each memory cell string can vary. Moreover, one skilled in the art would recognize that some of the memory cells among memory cells 210, 211, 212, and 213 of the memory cell strings of memory device 200 may be dummy memory cells. Dummy memory cells are memory cells that are not configured to store information. Dummy memory cells may be configured for purposes known to those skilled in the art. In some examples of memory device 200, one or two (or more) of memory cells at the two ends of each the memory cell strings of memory device 200 (e.g., memory cells immediately next to select gates 265, select gates 266, or both select gates 265 and 266) may be dummy memory cells.

In FIG. 3, each of the select circuits can include three select gates. For example, each of select circuits 241a, 242a, 243a, 244a, 241b, 244b, and 241c can include three select gates: one of select gates 262, one of select gates 264, and one of select gates 266. Each of select circuits 241'a, 242'a, 243'a, 244'a, 241'b, 244'b, and 241'c can include three select gates: one of select gates 261, one of select gates 263, and one of select gates 265.

Each of select gates 261 through 266 can operate as a transistor. A select line shared among particular select circuits can be shared by select gates of those particular select circuits. For example, select line $282_{A0}$ can be shared by select gates 262 of select circuit 241a, 242a, and 243a; select line $284_{A0}$ can be shared by select gates 264 of select circuit 241a, 242a, and 243a; and select line $286_{A0}$ can be shared by select gates 266 of select circuit 241a, 242a, and 243a. In another example, select line $281_{A0}$ can be shared by select gates 261 of select circuit 241'a, 242'a, and 243'a; select line $283_{A0}$ can be shared by select gates 263 of select circuit 241'a, 242'a, and 243'a; and select line $285_{A0}$ can be shared by select gates 265 of select circuit 241'a, 242'a, and 243'a.

A select line (e.g., select line $282_{A0}$) can carry a signal (e.g., signal $SGD3_{A0}$) but it does not operate like a switch (e.g., a transistor). A select gate (e.g., select gate 262) can receive a signal (e.g., signal $SGD3_{A0}$) from a respective select line (e.g., select line $282_{A0}$) and can operate like a switch (e.g., a transistor).

In order to focus on the embodiments discussed herein, the description below with reference to FIG. 4 through FIG. 9B focuses on sub-block $290_1$ including three memory cell strings 231a, 232a, and 233a, select circuits (e.g., drain select circuits) 241a, 242a, and 243a, and select circuits (e.g., source select circuit) 241'a, 242'a, and 243'a. Other memory cell strings and select circuits of memory device 200 have similar structures and connections.

Figure 4:
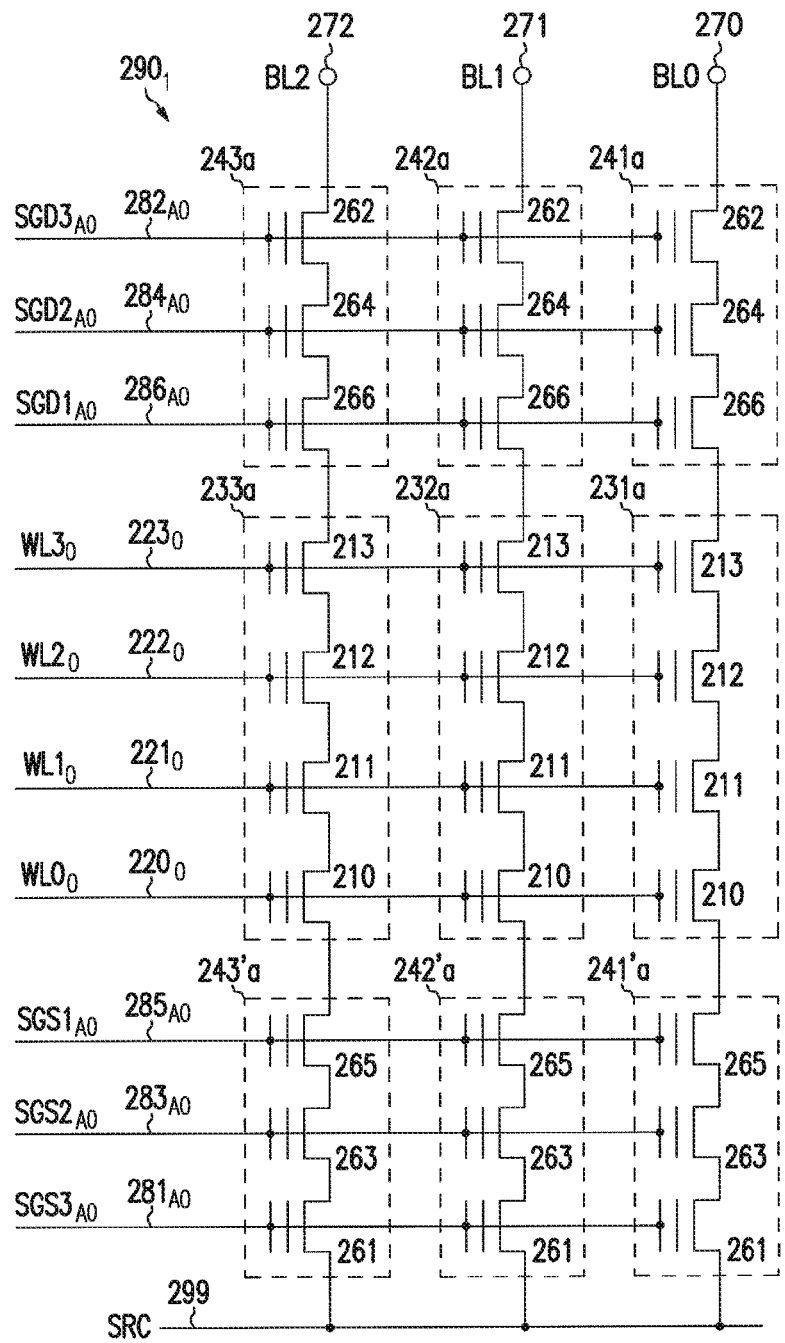
FIG. 4 shows a schematic diagram of a portion of the memory device of FIG. 3 including memory cell strings and select circuits coupled between a source and a respective data line, according to some embodiments described herein.

FIG. 4 shows a schematic diagram of a portion of memory device 200 of FIG. 3 including memory cell strings 231a, 232a, and 233a, and select circuits 241a, 242a, 243a, 241'a, 242'a, and 243'a coupled between line 299 and a respective data line among data lines 270, 271, and 272, according to some embodiments described herein. As shown in FIG. 4, select gates 262, 264, and 266 of each of select circuits 241a, 242a, and 243a can be coupled in series between a respective data line among data lines 270, 271, and 272 and a respective memory cell string among memory cell strings 231a, 232a, and 233a. Select gates 261, 263, and 265 of each of select circuits 241'a, 242'a, and 243'a can be coupled between line 299 and a respective memory cell string among memory cell strings 231a, 232a, and 233a.

Select gate 262 of each of select circuits 241a, 242a, and 243a has a terminal (e.g., a transistor gate) that can be part of (e.g., formed by a portion of) select line $282_{A0}$. Select gate 264 of each of select circuits 241a, 242a, and 243a has a terminal (e.g., a transistor gate) that can be part of (e.g., formed by a portion of) select line $284_{A0}$. Select gate 266 of each of select circuits 241a, 242a, and 243a has a terminal (e.g., a transistor gate) that can be part of (e.g., formed by a portion of) select line $286_{A0}$. Select gates 262, 264, and 266 can be controlled (e.g., turned on or turned off) by signals $SGD3_{A0}$, $SGD2_{A0}$, and $SGD1_{A0}$, respectively.

Select gate 261 of each of select circuits 241'a, 242'a, and 243'a has a terminal (e.g., a transistor gate) that can be part of (e.g., formed by a portion of) select line $281_{A0}$. Select gate 263 of each of select circuits 241'a, 242'a, and 243'a has a terminal (e.g., a transistor gate) that can be part of (e.g., formed by a portion of) select line $283_{A0}$. Select gate 265 of each of select circuits 241'a, 242'a, and 243'a has a terminal (e.g., a transistor gate) that can be part of (e.g., formed by a portion of) select line $285_{A0}$. Select gates 261, 263, and 265 can be controlled (e.g., turned on or turned off) by signals $SGS3_{A0}$, $SGS2_{A0}$, and $SGS1_{A0}$, respectively.

During an operation (e.g., a read or write operation) of memory device 200, signals $SGD1_{A0}$, $SGD2_{A0}$, and $SGD3_{A0}$ can be provided with voltages to either activate (e.g., concurrently turn on) or deactivate (e.g., concurrently turn off) select gates 262, 264, and 266 of each of select circuits 241a, 242a, and 243a, depending on whether or not memory cell strings 231a, 232a, and 233a are selected to be accessed. Similarly, during an operation (e.g., read or write operation) of memory device 200, signals $SGS1_{A0}$, $SGS2_{A0}$, and $SGS3_{A0}$ can be provided with voltages to either activate (e.g., concurrently turn on) or deactivate (e.g., concurrently turn off) select gates 261, 263, and 265 of each of select circuits 241'a, 242'a, and 243'a, depending on whether or not memory cell strings 231a, 232a, and 233a are selected to be accessed.

For example, in FIG. 4, during a write operation of memory device 200, if memory cell strings 231a, 232a, and 233a are selected to be accessed to store information in them, then select gates 262, 264, and 266 of select circuits 241a, 242a, and 243a can be activated (e.g., turned on) to couple (electrically couple) memory cell strings 231a, 232a, and 233a to data lines 270, 271, and 272, respectively; select gates 261, 263, and 265 of select circuits 241'a, 242'a, and 243'a may be deactivated (e.g., turned off). In another example, in FIG. 4, during a read operation of memory device 200, if memory cell strings 231a, 232a, and 233a are selected to be accessed to read information from them, then select gates 262, 264, and 266 of select circuits 241a, 242a, and 243a can be activated (e.g., turned on) to couple (electrically couple) memory cell strings 231a, 232a, and 233a to data lines 270, 271, and 272, respectively. In the read operation, select gates 261, 263, and 265 of select circuits 241'a, 242'a, and 243'a can also be activated (e.g., turned on) to couple (electrically couple) memory cell strings 231a, 232a, and 233a to line 299.

During the erase operation, signals $SGD3_{A0}$, $SGD2_{A0}$, $SGD1_{A0}$, $SGS3_{A0}$, $SGS2_{A0}$, and $SGS1_{A0}$ can be provided with a voltage to cause select gates 261 through 266 to be in a condition such that gate-induced drain-leakage (GIDL) current can be generated in order to help the erase operation. For example, the GIDL current generated by select gates 261 through 266 during the erase operation may speed up the charging of the body of the memory cell strings in the selected sub-block (e.g., memory cell strings 231a, 232a, and 233a).

Thus, as described above, select gates 261 through 266 can operate as switches (e.g., a transistor) during a read or write operation (to select a corresponding memory cell string during the read or write operation) and can operate as GIDL generators to generate GIDL current for the erase operations.

If memory cell strings 231a, 232a, and 233a are not selected (unselected) to be accessed (to store information in or read information from them) in an example operation of memory device 200, then select gates 261 through 266 can be deactivated (e.g., turned off).

FIG. 4 shows an example where select lines $282_{A0}$, $284_{A0}$, and $286_{A0}$ are uncoupled from each other and carry separate signals $SGD3_{A0}$, $SGD2_{A0}$, and $SGD1_{A0}$, respectively. Alternatively, select lines $282_{A0}$, $284_{A0}$, and $286_{A0}$ can be coupled (e.g., either physically or electrically coupled) to each other. Similarly, FIG. 4 shows an example where select lines $281_{A0}$, $283_{A0}$, and $285_{A0}$ are uncoupled from each other and carry separate signals $SGS3_{A0}$, $SGS2_{A0}$, and $SGS1_{A0}$, respectively. Alternatively, select lines $281_{A0}$, $283_{A0}$, and $285_{A0}$ can be coupled (e.g., either physically or electrically coupled) to each other.

Figure 5:
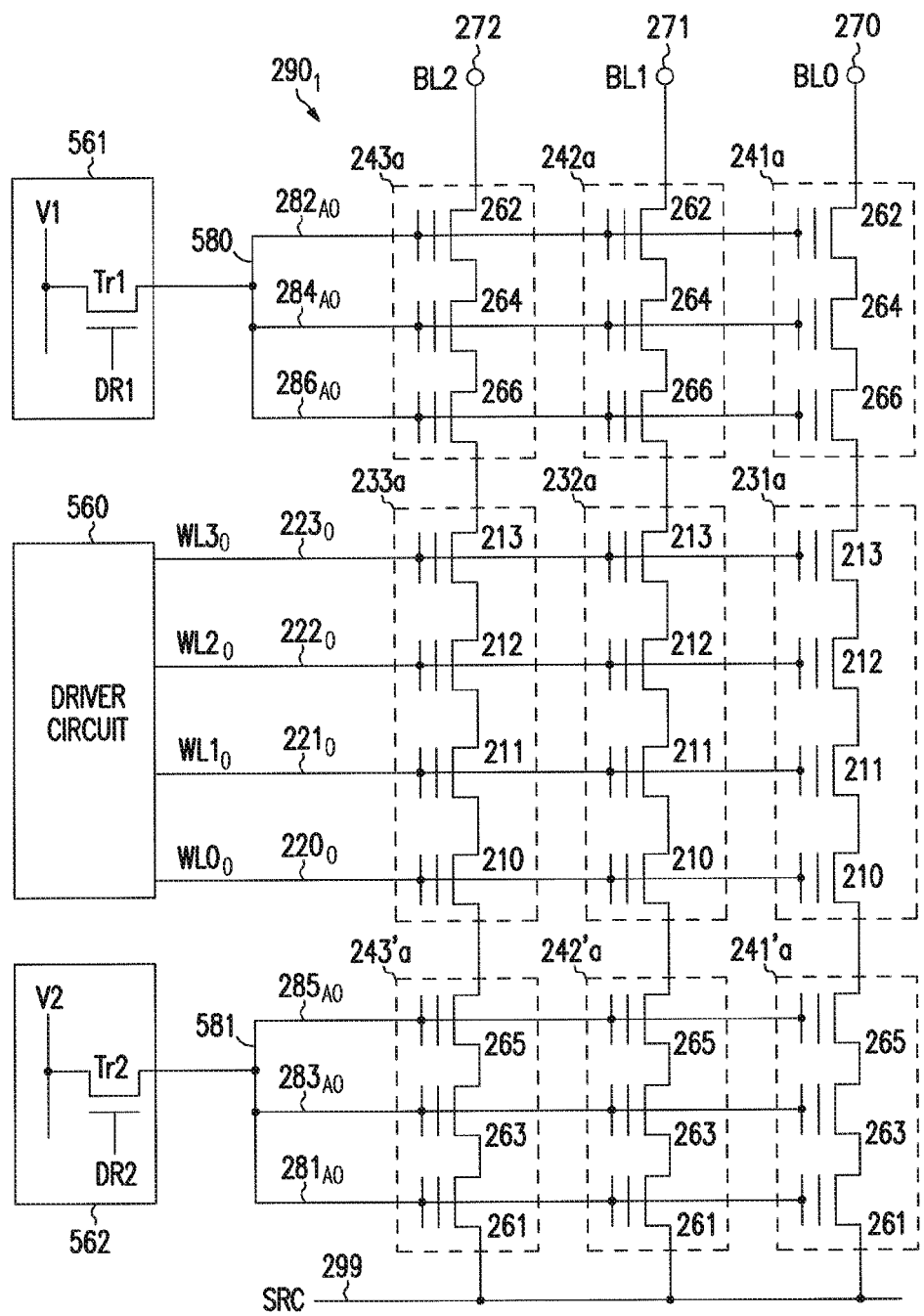
FIG. 5 shows a schematic diagram of the portion of the memory device of FIG. 4 where drain select lines are coupled to each other and source select lines are coupled to each other, according to some embodiments described herein.

FIG. 5 shows a schematic diagram of the portion of memory device 200 of FIG. 4 where select lines $282_{A0}$, $284_{A0}$, and $286_{A0}$ are coupled to each other through a connection 580, and select lines $281_{A0}$, $283_{A0}$, and $285_{A0}$ are coupled to each other through a connection 581, according to some embodiments described herein. As shown in FIG. 5, memory device 200 can include driver circuits 560, 561, and 562. Driver circuit 560 (e.g., word line driver circuit) can include drive transistors (not shown) that can operate to couple control lines $220_0$, $221_0$, $222_0$, and $223_0$ to signal lines (not shown). The signal lines can have the same voltages or different voltages, depending which memory cells among memory cells 210, 211, 212, and 213 of memory cell strings 231a, 232a, and 233a are selected to be accessed during an operation (e.g., a read or write operation) of memory device 200.

Driver circuit 561 can include a drive transistor (e.g., high voltage transistor (a transistor that may operate a voltage of 3V or higher)) Tr1 that can be controlled (e.g., turned on or turned off) by a signal DR1. Drive transistor Tr1 can operate to couple connection 580 to a signal line that has a signal (voltage signal) V1. Signal V1 can be provided with a voltage that has a value to activate (e.g., turn on) or deactivate (e.g., turn off) select gates 262, 264, and 266 of each of select circuits 241a, 242a, and 243a, depending on whether or not memory cell strings 231a, 232a, and 233a are selected to be accessed during an operation (e.g., a read or write operation) of memory device 200.

Driver circuit 562 can include a drive transistor (e.g., high voltage transistor) Tr2 that can be controlled (e.g., turned on or turned off) by a signal DR2. Drive transistor Tr2 can operate to couple connection 581 to a signal line that has a signal (voltage signal) V2. Signal V2 can be provided with a voltage that has a value to activate (e.g., turn on) or deactivate select gates 261, 263, and 265 of each of select circuits 241'a, 242'a, and 243'a, depending on whether or not memory cell strings 231a, 232a, and 233a are selected to be accessed during an operation (e.g., a read or write operation) of memory device 200.

Figure 6:
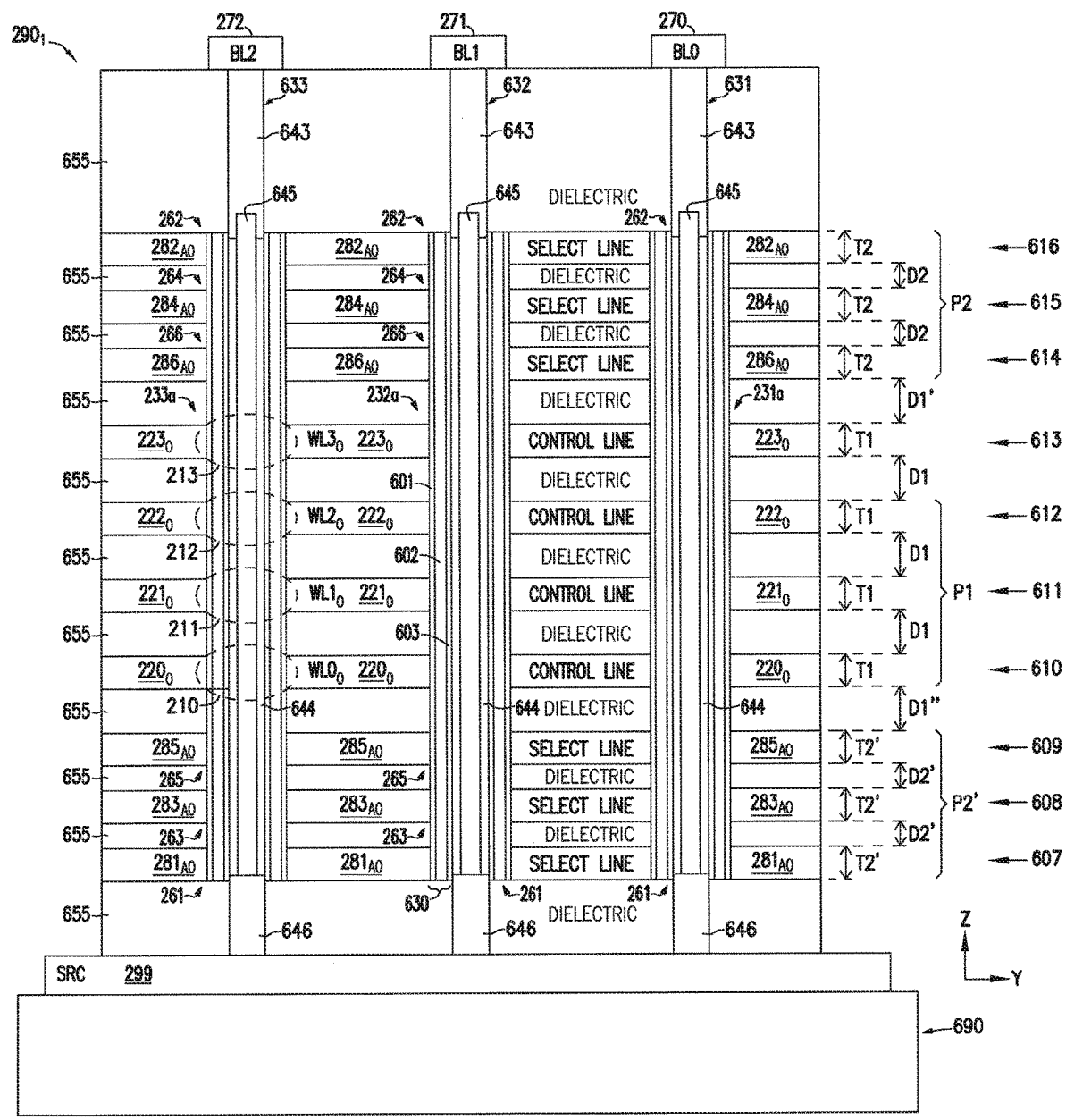
FIG. 6 shows a side view of a structure of a portion of the memory device of FIG. 4, according to some embodiments described herein.

FIG. 6 shows a side view of a structure of a portion of memory device 200, according to some embodiments described herein. The structure of memory device 200 in FIG. 6 corresponds to part of the schematic diagram of memory device 200 shown in FIG. 4 or FIG. 5. For simplicity, labels for some instances of similar elements are omitted from FIG. 6. As shown in FIG. 6, memory device 200 can include a substrate 690 over which memory cells 210, 211, 212, and 213 of memory cell strings 231a, 232a, and 233a of sub-block $290_1$ can be formed (e.g., formed vertically with respect to substrate 690). Memory device 200 includes different levels 607 through 616 with respect to a z-dimension. Levels 607 through 616 are internal device levels between substrate 690 and data lines 270, 271, and 272 of memory device 200. As shown in FIG. 6, memory cells 210, 211, 212, and 213 can be located in levels 610, 611, 612, and 613, respectively. Control lines $220_0$, $221_0$, $222_0$, and $223_0$ (associated with memory cells 210, 211, 212, and 213, respectively) can also be located in levels 610, 611, 612, and 613, respectively. Select lines $281_{A0}$, $283_{A0}$, and $285_{A0}$ can be located in different levels (e.g., levels 607, 608, and 609, respectively) between substrate 690 and memory cell strings 231a, 232a, and 233a. Select lines $282_{A0}$, $284_{A0}$, and $286_{A0}$ can be located in different levels (e.g., levels 616, 615, and 614, respectively), such that memory cell strings 231a, 232a, and 233a are between select lines $282_{A0}$, $284_{A0}$, and $286_{A0}$ and substrate 690.

Substrate 690 of memory device 200 can include monocrystalline (also referred to as single-crystal) semiconductor material. For example, substrate 690 can include monocrystalline silicon (also referred to as single-crystal silicon). The monocrystalline semiconductor material of substrate 690 can include impurities, such that substrate 690 can have a specific conductivity type (e.g., n-type or p-type). Although not shown in FIG. 6, substrate 690 can include circuitry that can be located directly under line 299 and pillars 631, 632, and 633. Such circuitry can include sense amplifiers, buffers (e.g., page buffers), decoders, and other circuit components of memory device 200.

Each of data lines 270, 271, and 272 has a width in the direction of the y-dimension (e.g., extending from left to right in the view shown in FIG. 6), which is perpendicular to the z-dimension. Each of data lines 270, 271, and 272 has a length extending in the direction of an x-dimension (e.g., shown in FIG. 3), which is perpendicular to the z-dimension and the y-dimension. Each of data lines 270, 271, and 272 can include a conductive material (e.g., conductively doped polycrystalline silicon (doped polysilicon), metals, or other conductive materials). Line 299 can include a conductive material and can have a length extending the direction of the y-dimension. FIG. 6 shows an example where line 299 (e.g., source) can be formed over a portion of substrate 690 (e.g., by depositing a conductive material over substrate 690). Alternatively, line 299 can be formed in or formed on a portion of substrate 690 (e.g., by doping a portion of substrate 690).

As shown in FIG. 6, memory device 200 can include pillars (conductive pillars) 631, 632, and 633 having lengths extending outwardly (e.g., vertically in the direction of the z-dimension of memory device 200) from a conductive material region of line 299. Each of pillars 631, 632, and 633 can include portions 643, 644, 645, and 646. Portion 643 of a respective pillar can be coupled (e.g., directly coupled) to a respective data line. For example, the material of portion 643 can directly contact a conductive material region of a respective data line among data lines 270, 271, and 272. Portion 646 of a respective pillar can be coupled (e.g., directly coupled) to line 299. For example, the material of portion 646 can directly contact a conductive material region of line 299. Portion 644 of a respective pillar can be between portions 643 and 646 of the respective pillar. Portion 645 of a respective pillar can be surrounded by portions 643, 644, and 646 of the respective pillar.

Each of portions 643, 644, and 646 can include conductive material (e.g., doped polycrystalline silicon). Portion 645 (e.g., a filler) can include dielectric material (e.g., an oxide of silicon, such as silicon dioxide). FIG. 6 shows an example where each of pillars 631, 632, and 633 includes portion 645 (e.g., dielectric material). Alternatively, portion 645 can be omitted, such that the material of portion 644 may also occupy the space occupied by portion 645.

Portions 643 and 646 can include materials of the same conductivity type. Portion 644 can include a material having a different conductivity type from that of portions 643 and 646. For example, portions 643 and 646 can include a semiconductor material of n-type (e.g., n-type polycrystalline silicon), and portion 644 can include a semiconductor material of p-type (e.g., p-type polycrystalline silicon). Alternatively, portions 643, 644, and 646 can include materials of the same conductivity type (e.g., n-type polycrystalline silicon).

Portion 644 and at least part of each of portions 643 and 646 can form a conductive channel (e.g., part of the body of the memory cell string) in a respective pillar among pillars 631, 632, and 633. The conductive channel can carry current (e.g., current between data lines 270, 271, and 272 and line 299 (e.g., source)) during an operation (e.g., read, write, or erase) of memory device 200. FIG. 6 shows an example where part of portion 643 can extend from a respective data line to a location in a respective pillar at approximately the level 616. However, part of portion 643 can extend to any location in a respective pillar between level 614 and 616.

As shown in FIG. 6, memory cells 210, 211, 212, and 213 of memory cell string 233a can be located along a segment of pillar 633 (e.g., the segment of pillar 633 extending from level 610 to level 613). In a similar structure, memory cells 210, 211, 212, and 213 (not labeled in FIG. 6) of memory cell strings 231a, and 232a can be located along a segment of a respective pillar among pillars 631 and 632.

Control lines $220_0$, $221_0$, $222_0$, $223_0$ (associated with respective memory cells 210, 211, 212, and 213) can be located along a segment (e.g., the segment extending from level 610 to level 613) of a respective pillar among pillars 631, 632, and 633. The materials of control lines $220_0$, $221_0$, $222_0$, $223_0$ can include a conductive material (e.g., conductively doped polycrystalline silicon of n-type, metals, or other conductive materials).

Select line $282_{A0}$ can be located in level 616 along a segment (segment at level 616) of each of pillars 631, 632, and 633. Select line $284_{A0}$ can be located in level 615 along a segment (segment at level 615) of each of pillars 631, 632, and 633. Select line $286_{A0}$ can be located in level 614 along a segment (segment at level 614) of each of pillars 631, 632, and 633. The materials of select lines $282_{A0}$, $284_{A0}$, and $286_{A0}$ can include conductively doped polycrystalline silicon, metals, or other conductive materials and can be the same as the conductive material of control lines $220_0$, $221_0$, $222_0$, $223_0$.

Select line $281_{A0}$ can be located in level 607 along a segment (segment at level 607) of each of pillars 631, 632, and 633. Select line $283_{A0}$ can be located in level 608 along a segment (segment at level 608) of each of pillars 631, 632, and 633. Select line $285_{A0}$ can be located in level 609 along a segment (segment at level 609) of each of pillars 631, 632, and 633. The materials of select lines $281_{A0}$, $283_{A0}$, and $285_{A0}$ can include conductively doped polycrystalline silicon, metals, or other conductive materials and can be the same as the material of control lines $220_0$, $221_0$, $222_0$, $223_0$.

As shown in FIG. 6, each of memory cell strings 231a, 232a, and 233a can include a structure 630, which includes portions 601, 602, and 603 between a respective pillar and control lines $220_0$, $221_0$, $222_0$, $223_0$. For example, structure 630 in memory cell string 232a is between pillar 632 and control lines $220_0$, $221_0$, $222_0$, and $223_0$. Each of memory cells 210, 211, 212, and 213 of memory cell string 232a can include part of structure 630 (part of portions 601, 602, and 603). Structure 630 can be part of a TANOS (TaN, $Al_2O_3$, $Si_3N_4$, $SiO_2$, Si) structure. For example, portion 601 (e.g., interpoly dielectrics) can include a charge blocking material or materials (e.g., a dielectric material such as TaN and $Al_2O_3$) that are capable of blocking a tunneling of a charge. Portion 602 can include a charge storage element (e.g., charge storage material or materials, such as $Si_3N_4$) that can provide a charge storage function (e.g., trap charge) to represent a value of information stored in memory cells 210, 211, 212, or 213. Portion 603 can include a tunnel dielectric material or materials (e.g., $SiO_2$) that are capable of allowing tunneling of a charge (e.g., electrons). As an example, portion 603 can allow tunneling of electrons from portion 644 to portion 602 during a write operation and tunneling of electrons from portion 602 to portion 644 during an erase operation of memory device 200. Moreover, portion 603 can allow tunneling of holes from portion 644 to portion 602, compensating the trapped electron recombination during an erase operation of memory device 200. In an alternative arrangement of memory device 200, structure 630 can be part of a SONOS (Si, $SiO_2$, $Si_3N_4$, $SiO_2$, Si) structure. In another alternative arrangement, structure 630 can be part of a floating gate structure.

As shown in FIG. 6, a select line (e.g., $282_{A0}$, $284_{A0}$, $286_{A0}$, $281_{A0}$, $283_{A0}$, or $285_{A0}$) is a piece (e.g., a single layer) of conductive material (e.g., polycrystalline silicon, metal, or other conductive materials). As described above, a select line can carry a signal (e.g., signal $SGD1_{A0}$, $SGD2_{A0}$, $SGD3_{A0}$, $SGS1_{A0}$, $SGS2_{A0}$, or $SGS3_{A0}$ in FIG. 3) but it does not operate like a switch (e.g., a transistor). A select gate (e.g., each of select gates 261 through 266) can include a portion of a respective select line (e.g., a portion of the piece of the conductive material that forms the respective select line) and additional structures to perform a function (e.g., function of a transistor). For example, in FIG. 6, select gate 262 can include a portion of select line $282_{A0}$ and a portion of structure 630, and select gate 261 can include a portion of select line $281_{A0}$ and portion of structure 630.

FIG. 6 shows an example where select gates 261 through 266 have the same structure (e.g., TANOS structure) as memory cells 210, 211, 212, and 213. Alternatively, select gates 261, 263, and 265 (e.g., source select gate), select gates 262, 264, and 268 (e.g., drain select gate), or select gates 261 through 266 (both source select gates and drain select gates) can have a different structure, such as a field-effect transistor (FET) structure. An example of an FET includes a metal-oxide semiconductor (MOS) transistor structure. As is known to those skilled in the art, an FET usually includes a transistor gate, a transistor body channel, and a gate oxide between the transistor gate and the transistor body channel that can be in direct contact with the transistor gate and the transistor body channel.

As shown in FIG. 6, two adjacent control lines (two control lines located immediately vertically next to each other in the direction of the z-dimension) among control lines $220_0$, $221_0$, $222_0$, and $223_0$ are vertically separated from each other by a distance (e.g., spacing) D1. Two adjacent select lines (e.g., two drain select lines located immediately vertically next to each other in the direction of the z-dimension) among select lines $282_{A0}$, $284_{A0}$, and $286_{A0}$ are vertically separated from each other by a distance (e.g., spacing) D2. Two adjacent select lines (e.g., two source select lines located immediately vertically next to each other in the direction of the z-dimension) among select lines $281_{A0}$, $283_{A0}$, and $285_{A0}$ are vertically separated from each other by a distance (e.g., spacing) D2'. Distances D2 and D2' can be the same (e.g., substantially equal). Each of distances D2 and D2' can be less than (e.g., shorter than) distance D1.

As shown in FIG. 6, distance D1 is a vertical distance (e.g., vertical spacing) measured from the nearest top or bottom edge (surfaces directly facing each other with respect to the z-dimension) of any of two vertically adjacent control lines. As described above, each of control lines $220_0$, $221_0$, $222_0$, and $223_0$ can be formed from a conductive material (e.g., metal or another conductive material). Thus, distance D1 can be measured between two nearest edges of the materials that form two adjacent control lines. For example, distance D1 can be measured from the nearest edges of the materials that form control lines $220_0$ and $221_0$, the nearest edges of the materials that form control lines $221_0$ and $222_0$, or the nearest edges of the materials that form control lines $222_0$ and $223_0$.

Distance D2 is a vertical distance (e.g., vertical spacing) measured from the nearest top or bottom edge (surfaces directly facing each other with respect to the z-dimension) of any two vertically adjacent select lines among select lines $282_{A0}$, $284_{A0}$, and $286_{A0}$. As described above, each of the select lines among select lines $282_{A0}$, $284_{A0}$, and $286_{A0}$ can be formed from a conductive material (e.g., metal or another conductive material). Thus, distance D2 can be measured between two nearest edges of the materials that form two adjacent select lines among select lines $282_{A0}$, $284_{A0}$, and $286_{A0}$. For example, distance D2 can be measured between the nearest edges of the materials that form select lines $282_{A0}$ and $284_{A0}$, or the nearest edges of the materials that form select lines $284_{A0}$ and $286_{A0}$.

Distance D2' is a vertical distance (e.g., vertical spacing) measured from the nearest top or bottom edge (edges with respected to the z-dimension sides directly facing each other with respect to the z-dimension) of any of two vertically adjacent select lines among select lines $281_{A0}$, $283_{A0}$, and $285_{A0}$. As described above, each of the select lines among select lines $281_{A0}$, $283_{A0}$, and $285_{A0}$ can be formed from a conductive material (e.g., metal or another conductive material). Thus, distance D2' can be measured between two nearest edges of the materials that form two adjacent select lines among select lines $281_{A0}$, $283_{A0}$, and $285_{A0}$. For example, distance D2' can be measured between the nearest edges of the materials that form select lines $281_{A0}$ and $283_{A0}$, or the nearest edges of the materials that form select lines $283_{A0}$ and $285_{A0}$.

FIG. 6 also shows distance D1' and D1" between elements in memory device 200. Distance D1' is a vertical distance (e.g., vertical spacing) between the select line (e.g., $286_{A0}$ among select lines $282_{A0}$, $284_{A0}$, and $286_{A0}$ in this example) that is nearest to control lines $220_0$, $221_0$, $222_0$, and $223_0$, and the control line (e.g., $223_0$) that is nearest to select lines $282_{A0}$, $284_{A0}$, and $286_{A0}$ (nearest to select line $286_{A0}$ in this example). Thus, distance D1' can be measured between two nearest edges of the materials that form select line $286_{A0}$ and control line $223_0$. Distance D1" is a vertical distance (e.g., vertical spacing) between the select line (e.g., $285_{A0}$ among select lines $281_{A0}$, $283_{A0}$, and $285_{A0}$ in this example) that is nearest to control lines $220_0$, $221_0$, $222_0$, and $223_0$ and the control line (e.g., $220_0$) that is nearest to select lines $281_{A0}$, $283_{A0}$, and $285_{A0}$ (nearest to select line $285_{A0}$ in this example). Thus, distance D1" can be measured between two nearest edges of the materials that form select line $285_{A0}$ and control line $220_0$.

As shown in FIG. 6, each of control lines $220_0$, $221_0$, $222_0$, and $223_0$ has a thickness T1 in the z-dimension. Thickness T1 is a vertical thickness of the material of a respective control line among control lines $220_0$, $221_0$, $222_0$, and $223_0$. Each of select lines $282_{A0}$, $284_{A0}$, and $286_{A0}$ has a thickness T2 in the z-dimension. Thickness T2 is a vertical thickness of the material of a respective select line among select lines $282_{A0}$, $284_{A0}$, and $286_{A0}$. Each of select lines $281_{A0}$, $283_{A0}$, and $285_{A0}$ has a thickness T2' in the z-dimension. Thickness T2' is a vertical thickness of the material of a respective select line among select lines $281_{A0}$, $283_{A0}$, and $285_{A0}$. Thicknesses T1, T2, and T2' can be the same (e.g., substantially equal). Alternatively, thicknesses T2 and T2' can be the same (e.g., substantially equal) and each of thicknesses T2 and T2' can be less than thickness T1.

As shown in FIG. 6, memory device 200 can include a dielectric (e.g., an oxide of silicon) 655 located between elements of memory device 200. For example, dielectric 655 can be located (e.g., occupy the space) between two adjacent control lines among control lines $220_0$, $221_0$, $222_0$, and $223_0$. Thus, distance D1 can be the thickness of the material (e.g., an oxide of silicon) of a respective dielectric (e.g., dielectric 655) between two adjacent control lines among control lines $220_0$, $221_0$, $222_0$, and $223_0$.

Dielectric 655 can also be located (e.g., occupy the space) between two adjacent select lines among select lines $282_{A0}$, $284_{A0}$, and $286_{A0}$. Thus, distance D2 can be the thickness of the material (e.g., an oxide of silicon) of a respective dielectric (e.g., dielectric 655) between two adjacent select lines among select lines $282_{A0}$, $284_{A0}$, and $286_{A0}$.

Dielectric 655 can also be located (e.g., occupy the space) between two adjacent select lines among select lines $281_{A0}$, $283_{A0}$, and $285_{A0}$. Thus, distance D2' can be the thickness of the material (e.g., an oxide of silicon) of a respective dielectric (e.g., dielectric 655) between two adjacent select lines among select lines $281_{A0}$, $283_{A0}$, and $285_{A0}$.

FIG. 6 shows pitches P1, P2, and P2' in the elements of memory device 200. Pitch P1 is a measurement (e.g., in nanometers) of a vertical spacing of a combination of thicknesses T1 of control lines $220_0$, $221_0$, and $222_0$, distance D1 between control lines $220_0$ and $221_0$, and distance D1 between control lines $221_0$ and $222_0$. Pitch P2 is a measurement (e.g., in nanometers) of a vertical spacing of a combination of thicknesses T2 of select lines $282_{A0}$, $284_{A0}$, and $286_{A0}$, distance D2 between select lines $282_{A0}$ and $284_{A0}$, and distance D2 between select lines $284_{A0}$ and $286_{A0}$. Pitch P2' is a measurement (e.g., in nanometers) of a vertical spacing of a combination of thicknesses T2' of select lines $281_{A0}$, $283_{A0}$, and $285_{A0}$, distance D2' between select lines $281_{A0}$ and $283_{A0}$, and distance D2' between select lines $283_{A0}$ and $285_{A0}$.

As shown in in FIG. 6, pitches P2 and P2' can be the same (e.g., substantially equal). Each of pitches P2 and P2' can be less than pitch P1. Differences in pitches P1 and each of pitches P2 and P2' may allow memory device 200 to have improvements over some conventional memory devices.

For example, in some conventional memory devices (e.g., 3-D NAND flash memory devices), the pitch of the select lines is the same as the pitch of the control lines. This may make it difficult for the select gates associated with the select lines to generate GIDL current for erase operations in the conventional memory devices due to process fluctuation. Such process fluctuation may cause over-etching at the bottom of the pillars and may cause difficulty in control of impurity concentration. The process fluctuation may also cause the desired point of the electric field for the GIDL generation to be out of alignment. Thus, in some conventional memory devices, the intensity of the GIDL current during an erase operation can have a wide distribution, which may degrade device performance.

In memory device 200, by providing multiple select lines (e.g., multiple drain select lines and multiple source select lines) and by making the pitch (e.g., pitch P2 and pitch P2' in FIG. 6) of the select lines less than (e.g., tighter than) the pitch (e.g., pitch P1 in FIG. 6) of the control lines, a stable GIDL generation may be obtained. This may allow memory device 200 to have an improvement (e.g., improvement in device performance) over some conventional memory devices. Further, making the pitch of the select lines less than the pitch of the control lines may allow for a more robust process during fabrication of memory device 200 that may avoid or reduce over-etching of the bottom of the pillars and may enhance impurity concentration control. Moreover, the tighter pitch of the select lines (e.g., P2<P1 and P2'<P1 in FIG. 6) may allow the drain select gates to be coupled to each other (e.g., through connection 580 in FIG. 5) and the source select gates to be coupled to each other (e.g., through connection 581 in FIG. 5). This may further improve (e.g., simplify) control of signals provided to source and drain select lines of memory device 200. In addition, making the thickness (e.g., T2 or T2' in FIG. 6) of the source and drain select lines the same as the thickness (e.g., T1 in FIG. 6) of the control lines may also simplify the processes of making the source and drain select lines of memory device 200.

Figure 7A:
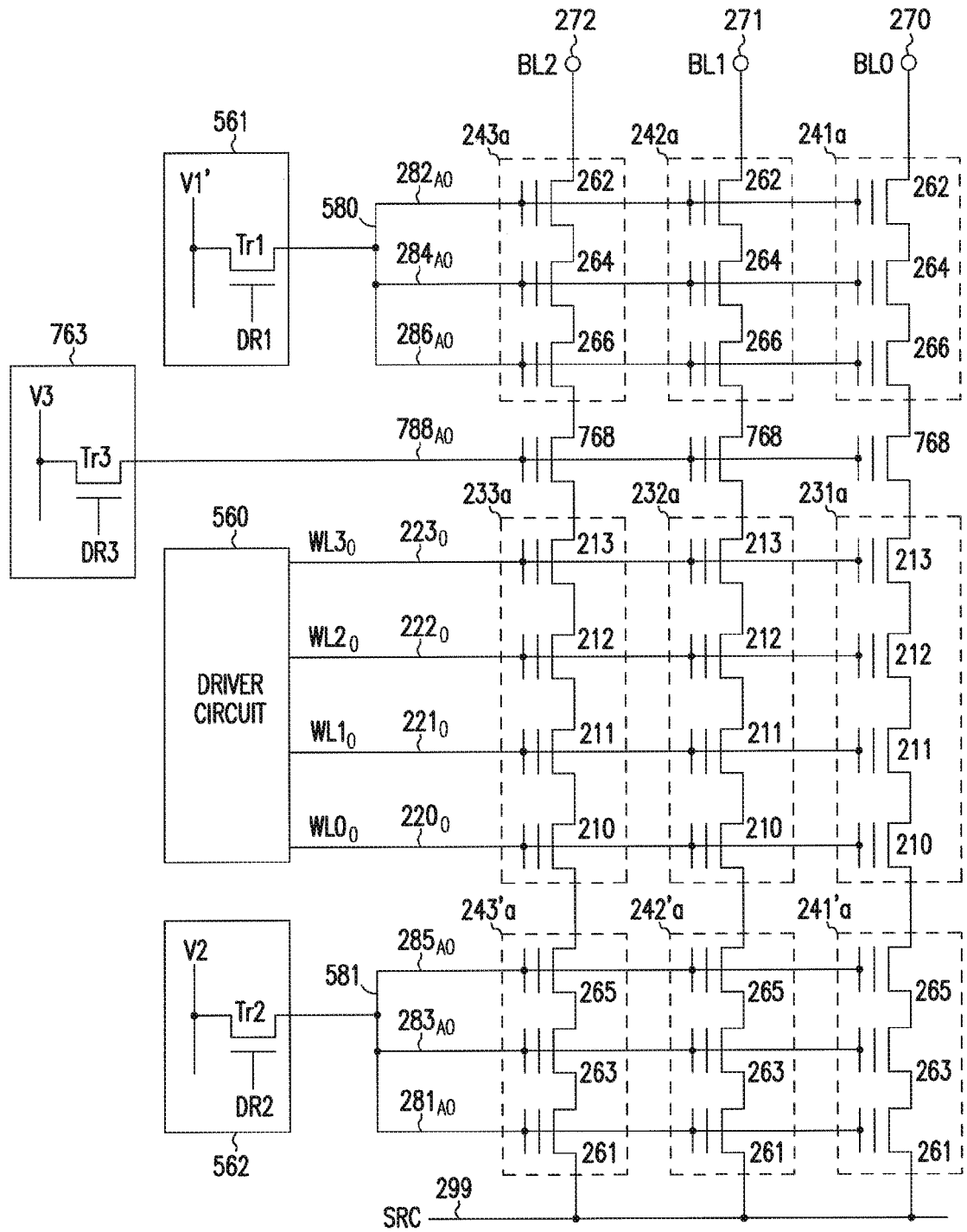
FIG. 7A shows a block diagram of a portion of a memory device, which can be a variation of the memory device of FIG. 5, including an additional drain select line, according to some embodiments described herein.

FIG. 7A shows a block diagram of a portion of a memory device 700, which can be a variation of memory device 200 of FIG. 5, according to some embodiments described herein. Memory device 700 includes elements similar to or identical to those of memory device 200 of FIG. 5. For simplicity, the description of similar or identical elements (which have the same labels in FIG. 5 and FIG. 7A) between memory devices 200 and 700 is not repeated in the description of FIG. 7A.

As shown in FIG. 7A, besides including elements that are similar to (or the same as) the elements of memory device 200 (FIG. 5), memory device 700 can include a select line $788_{A0}$ (an additional drain select line) and select gates 768 (additional select gates). Select gates 768 can be controlled (e.g., turned on or turned off) by select line $788_{A0}$. Memory device 700 can also include a driver circuit 763 that can include a drive transistor (e.g., high voltage transistor) Tr3 that can be controlled (e.g., turned on or turned off) by a signal DR3. Drive transistor Tr3 can operate to couple select line $788_{A0}$ to a signal line that has a signal (voltage signal) V3. Signal V3 can be provided with a voltage that has a value to activate (e.g., turn on) or deactivate (e.g., turn off) select gates 768, depending on whether or not memory cell strings 231a, 232a, and 233a are selected to be accessed during an operation (e.g., a read or write operation) of memory device 700.

Select gates 768 and select gates 262, 266, and 264 can operate to serve different functions in different operations. As described above with reference to FIG. 4, select gates 261 through 266 (FIG. 4) can operate to serve as string selectors (e.g., as switches) during a read or write operation (to select respective memory cell strings during the read or write operation), and operate to serve as GIDL generators (to generate GIDL current) during an erase operation. Thus, in memory device 200 of FIG. 4, the same select gates (e.g., 261 through 266) can operate to serve different functions (e.g., string selection and GIDL generation functions) in different operations.

However, in memory device 700 of FIG. 7A, memory cell string selection and GIDL generation functions can be performed by different select gates. During a read or write operation, select gates 262, 266, and 264 of select circuits 241a, 242a, and 243a can be activated (e.g., turned on) to serve as pass transistors. As an example, the value of the voltage provided to signal V1' during a read or write operation can be approximately 3V to 5V (or other values), such that the value of the voltage applied to select lines 282$_{A0}$, 284$_{A0}$, and 286$_{A0}$ (through drive transistor Tr1 and connection 580) can also be approximately 3V to 5V in order to activate select gates 262, 266, and 264. During a read or write operation, select gates 768 can be activated (e.g., turned on) and operate (as switches) to serve as string selectors if memory cell strings 231a, 232a, and 233a are selected to be accessed. Select gates 768 can be activated by turning on drive transistor Tr3 in order to apply signal V3 (e.g., V3=1V to 3V in a read or write operation) to select line 788$_{A0}$ (which controls select gates 768). The value of the voltage provided to signal V3 during a read or write operation can be the same as the value of the supply voltage (e.g., Vcc, not shown in FIG. 7A) of memory device 700.

In an erase operation, select gates 262, 266, and 264 of select circuits 241a, 242a, and 243a can be placed in a condition such that select gates 262, 266, and 264 can operate as GIDL generators to generate GIDL current for the erase operation. For example, during an erase operation, drive transistor Tr1 can be turned on to apply signal V1' to select lines 282$_{A0}$, 284$_{A0}$, and 286$_{A0}$. The value of the voltage provided to signal V1' during an erase operation can be close to the value of the voltage (e.g., $V_{ERASE}$, not shown in FIG. 7A) applied to data lines 270, 271, and 272 (e.g., $V_{ERASE}$=20V and V1'=15V to 17V) during the erase operation. The value of the voltage $V_{ERASE}$ can be much greater than the value of the supply voltage (e.g., Vcc=1V to 3V) of memory device 700. In an erase operation, select gates 768 can be placed in a "float" condition, such that they may not operate as GIDL generators (may not generate GIDL current for the erase operation). In an erase operation, select line 788$_{A0}$ can be placed in a "float" state to cause select gates 768 to be placed in the float condition. In the float state, select line 788$_{A0}$ can be decoupled from the signal line that provides signal V3 (e.g., drive transistor Tr3 can be turned off).

Figure 7B:
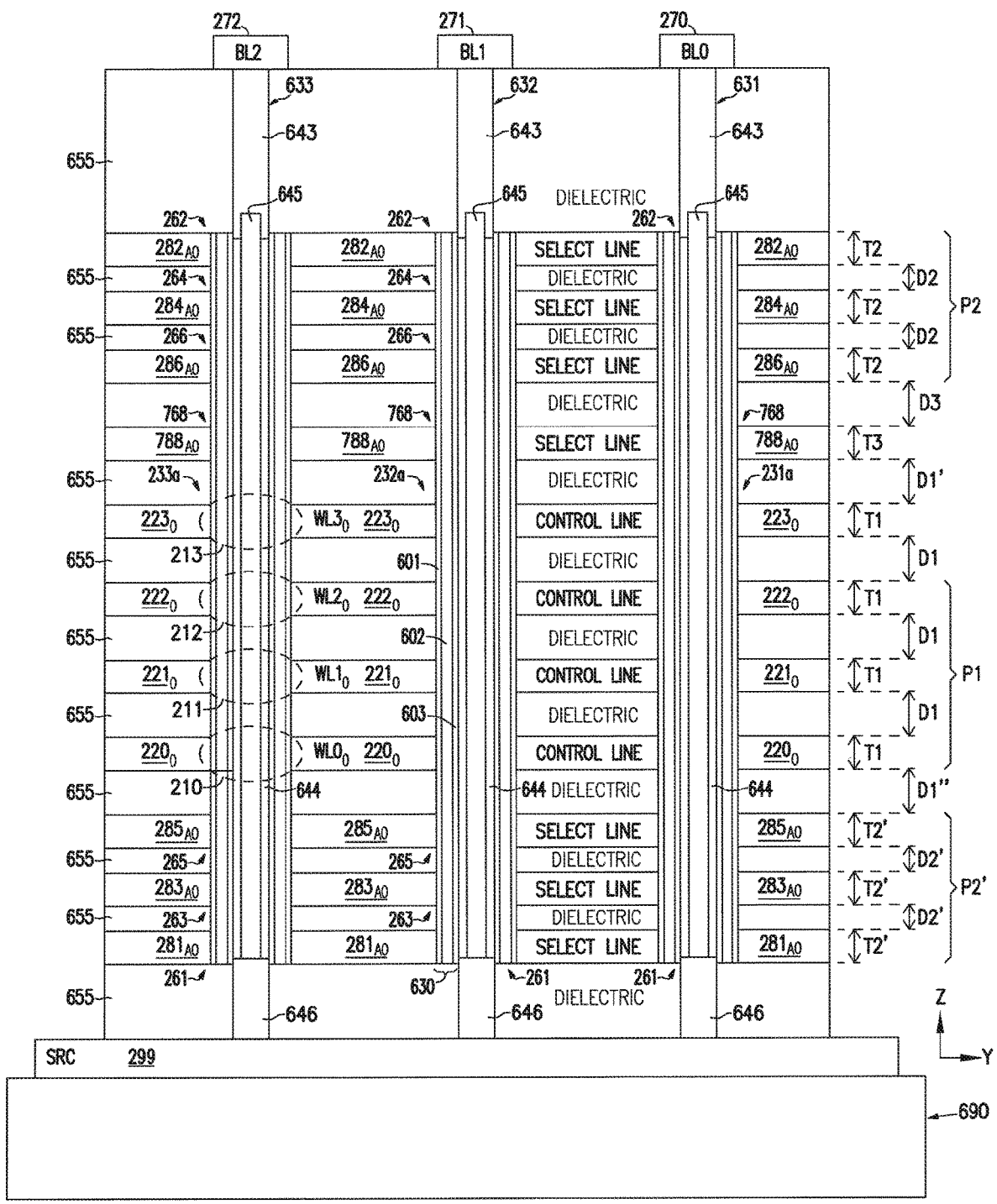
FIG. 7B shows a side view of a structure of a portion of the memory device of FIG. 7A, according to some embodiments described herein.

FIG. 7B shows a side view of a structure of a portion of memory device 700, according to some embodiments described herein. The structure of memory device 700 in FIG. 7B can be a variation of the structure of memory device 200 of FIG. 6. For simplicity, the description of similar or identical elements (which have the same labels in FIG. 6 and FIG. 7B) between memory devices 200 and 700 is not repeated in the description of FIG. 7B. Differences between memory device 700 of FIG. 7B and memory device 200 (FIG. 6) include, as shown in FIG. 7B, select line 788$_{A0}$.

As shown in FIG. 7B, select line 788$_{A0}$ is adjacent (located immediately next to) control line 223$_0$ and vertically separated from control line 223$_0$ by a distance (e.g., spacing) D1' (which can be the same as distance D1' of FIG. 6). Select line 788$_{A0}$ is adjacent (located immediately next to) select line 286$_{A0}$ and vertically separated from select line 286$_{A0}$ by a distance (e.g., spacing) D3. Distance D3 is a vertical distance (e.g., vertical spacing) measured between two nearest edges of the materials that form select line 286$_{A0}$ and select line 788$_{A0}$. Distances D1' and D3 can be the same (e.g., substantially equal). Distances D1 and D3 can be the same. Select line 788$_{A0}$ has a thickness T3 that can be the same as (e.g., substantially equal to) thickness T1. Each of select gates 768 can have the same structure (e.g., TANOS structure) as memory cells 210, 211, 212, and 213. Memory device 700 (FIG. 7A and FIG. 7B) can include improvements at least similar to those of memory device 200.

Figure 8A:
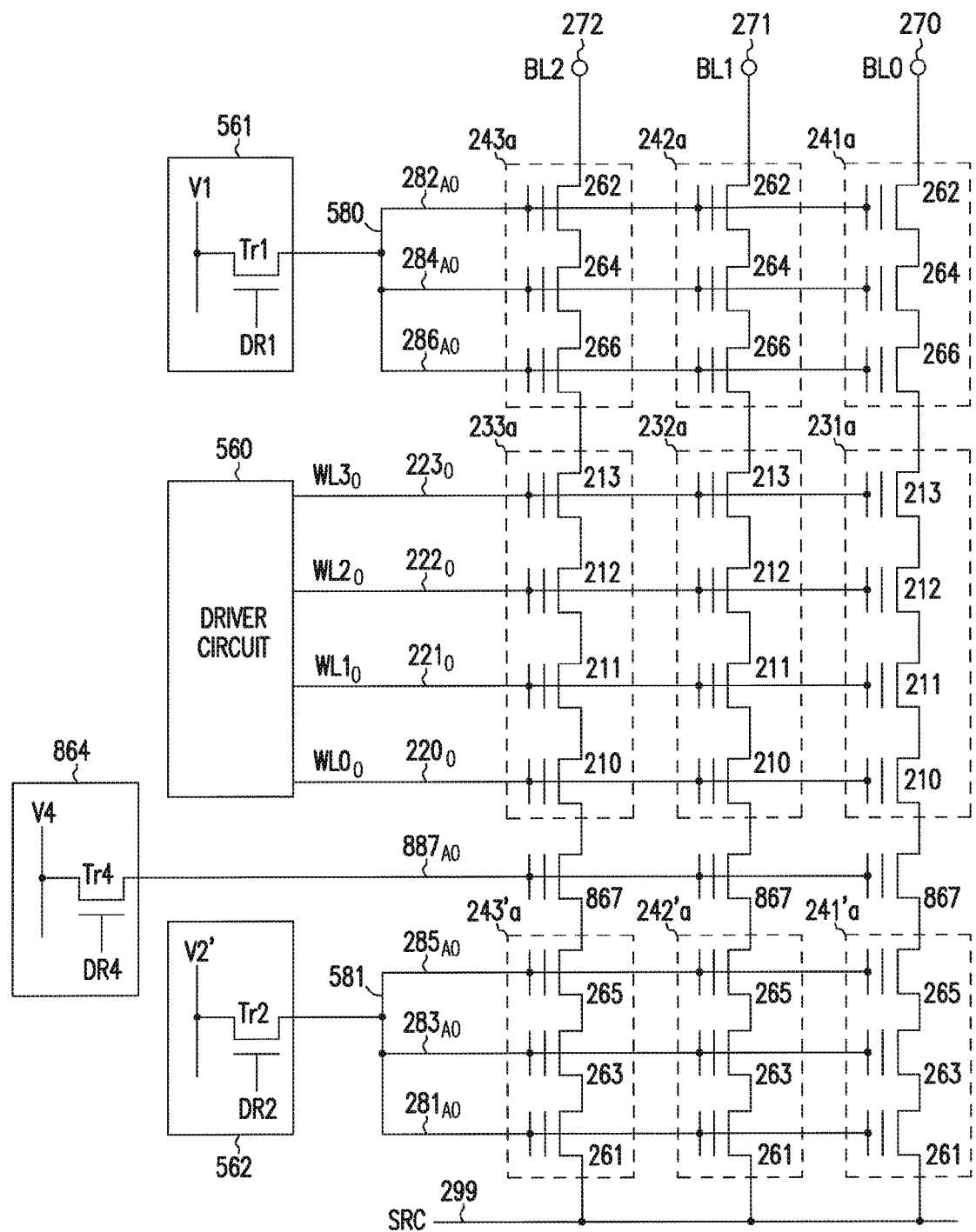
FIG. 8A shows a block diagram of a portion of a memory device, which can be another variation of the memory device of FIG. 5, including an additional source select line, according to some embodiments described herein.

FIG. 8A shows a block diagram of a portion of a memory device 800, which can be a variation of memory device 200 of FIG. 5, according to some embodiments described herein. Memory device 800 includes elements similar to or identical to those of memory device 200 of FIG. 5. For simplicity, the description of similar or identical elements (which have the same labels in FIG. 5 and FIG. 8A) between memory devices 200 and 800 is not repeated in the description of FIG. 8A.

As shown in FIG. 8A, besides including elements that are similar to (or the same as) the elements of memory device 200 (FIG. 5), memory device 800 can include an additional select line (additional source select line) 887$_{A0}$ and select gates 867. Memory device 800 can also include a driver circuit 864 that can include a drive transistor (e.g., high voltage transistor) Tr4 that can be controlled (e.g., turned on or turned off) by a signal DR4. Drive transistor Tr4 can operate to couple select line 887$_{A0}$ to a signal line that has a signal (voltage signal) V4. Signal V4 can be provided with a voltage that has a value to activate (e.g., turn on) or deactivate (e.g., turn off) select gates 867, depending on whether or not memory cell strings 231a, 232a, and 233a are selected to be accessed during an operation (e.g., a read or write operation) of memory device 800.

The operations and functions of select gates 261, 263, and 265 can be similar to those of select gates 262, 264, and 266 of FIG. 7A. For example, select gates 261, 263, and 265 of FIG. 8A can operate to serve as pass transistors during a read or write operation of memory device 800 and operate to serve as GIDL generators to generate GIDL current during an erase operation of memory device 800. Signal V2' can be provided with voltages having values similar to those of signal V1' of FIG. 7A. For example, during a read or write operation, the value of the voltage provided to signal V2' in FIG. 8A can be approximately 3V to 5V (or other values). During an erase operation, signal V2' can be provided with a voltage (e.g., 15V to 17V) close to the value of an erase voltage (e.g., $V_{ERASE}$=20V, not shown in FIG. 8A) applied to line 299 during the erase operation.

The operations and functions of select gates 867 of FIG. 8A can be similar to those of select gates 768 of FIG. 7A. For example, select gates 867 of FIG. 8A can operate (e.g., as switches) to serve as memory cell string selectors during a read or write operation of memory device 800. Select gates 867 can be placed in a float condition (e.g., not to serve as GIDL generators) during an erase operation of memory device 800. During a read or write operation, signal V4 can be provided with voltages having values similar to those of signal V3 of FIG. 7A. In an erase operation, select line 887$_{A0}$ can be placed in a "float" state to cause select gates 867 to be placed in the float condition. In the float state, select line 887$_{A0}$ can be decoupled from the line that provides signal V4 (e.g., Tr4 can be turned off).

Figure 8B:
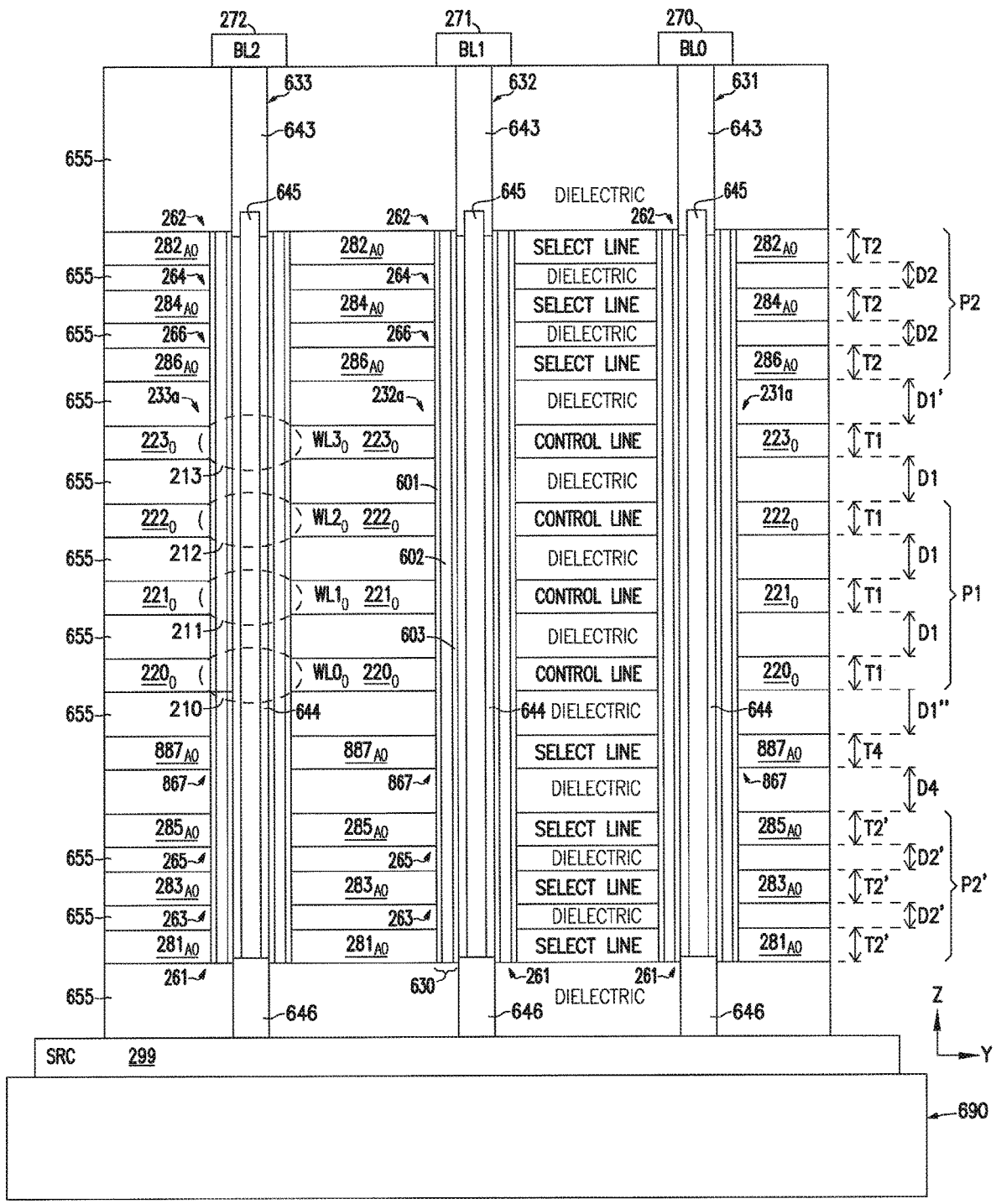
FIG. 8B shows a side view of a structure of a portion of the memory device of FIG. 8A, according to some embodiments described herein.

FIG. 8B shows a side view of a structure of a portion of memory device 800, according to some embodiments described herein. The structure of memory device 800 in FIG. 8B can be a variation of the structure of memory device 200 of FIG. 6. For simplicity, the description of similar or identical elements (which have the same labels in FIG. 6 and FIG. 8B) between memory devices 200 and 800 is not repeated in the description of FIG. 8B. Differences between memory device 800 of FIG. 8B and memory device 200 (FIG. 6) include, as shown in FIG. 8B, select line $887_{A0}$.

As shown in FIG. 8B, select line $887_{A0}$ is adjacent (located immediately next to) control line $220_0$ and vertically separated from control line $220_0$ by a distance (e.g., spacing) D1″ (which can be the same as distance D1″ of FIG. 6). Select line $887_{A0}$ is adjacent (located immediately next to) select line $285_{A0}$ and vertically separated from select line $285_{A0}$ by a distance (e.g., spacing) D4. Distance D4 is a vertical distance (e.g., vertical spacing) measured between two nearest edges of the materials that form select line $285_{A0}$ and select line $887_{A0}$. Distances D1″ and D4 can be the same (e.g., substantially equal). Distances D1 and D4 can be the same (e.g., substantially equal). Select line $887_{A0}$ has a thickness T4 that can be the same as (e.g., substantially equal to) thickness T1. Each of select gates 867 can have the same structure (e.g., TANOS structure) as memory cells 210, 211, 212, and 213. Memory device 800 (FIG. 8A and FIG. 8B) can include improvements at least similar to those of memory device 200.

Figure 9A:
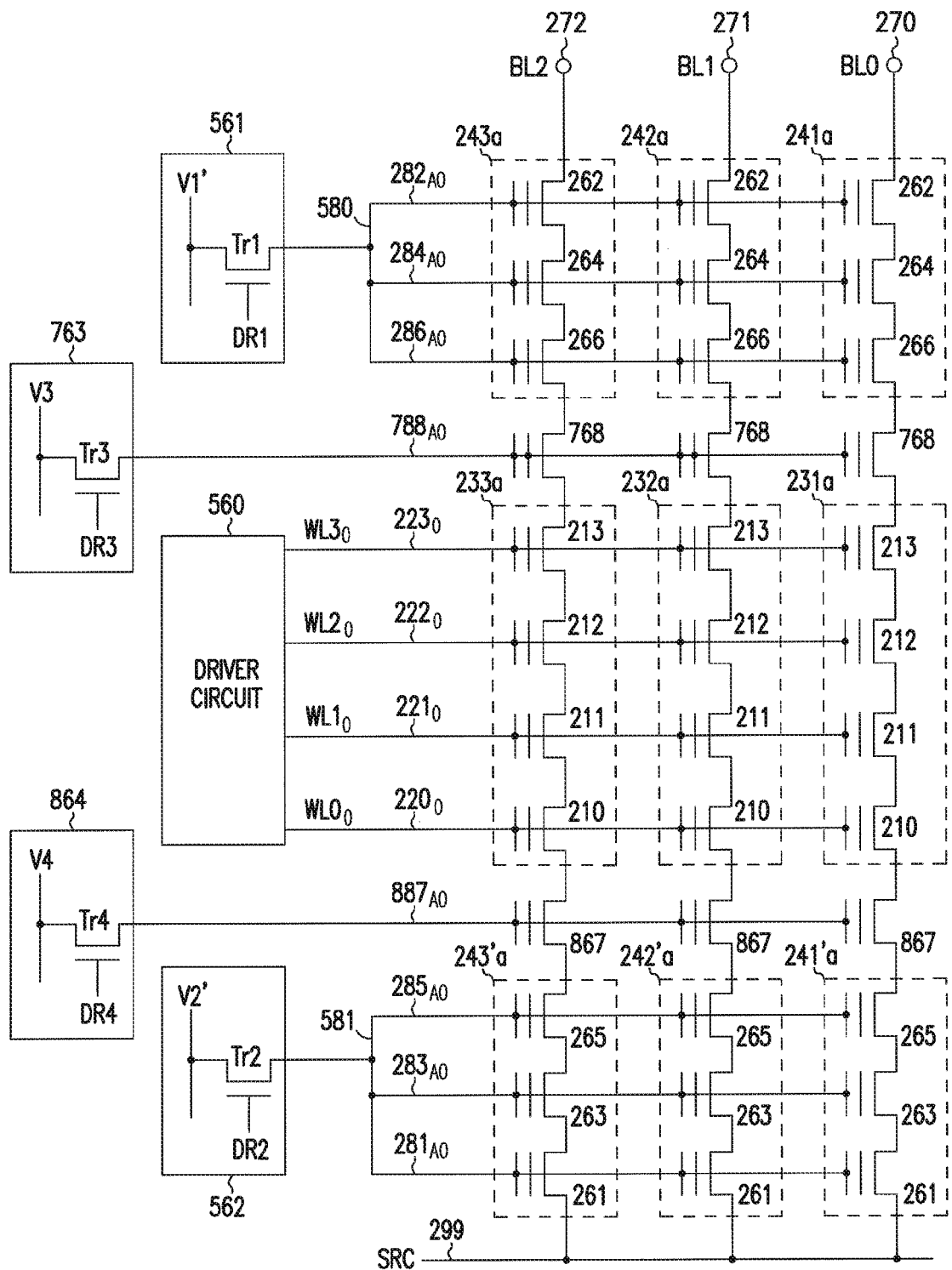
FIG. 9A shows a block diagram of a portion of a memory device, which can be a further variation of the memory device of FIG. 5, including additional drain and source select lines, according to some embodiments described herein.

FIG. 9A shows a block diagram of a portion of a memory device 900, which can be a variation of memory device 500 of FIG. 5. Memory device 900 includes elements and performs operations similar to or identical to those of memory device 200 of FIG. 5, memory device 700 of FIG. 7A, and memory device 800 of FIG. 8A. For example, as shown in FIG. 9A, memory device 900 can include a combination of a portion of memory device 700 (FIG. 7A) and a portion of memory device 800 (FIG. 8A). For simplicity, the description of similar or identical elements (which have the same labels in FIG. 5, FIG. 7A, FIG. 8A, and FIG. 9A) among memory device 200 (FIG. 5), memory device 700 (FIG. 7A), memory device 800 (FIG. 8A), and memory device 900 are not repeated in the description of FIG. 9A.

Figure 9B:
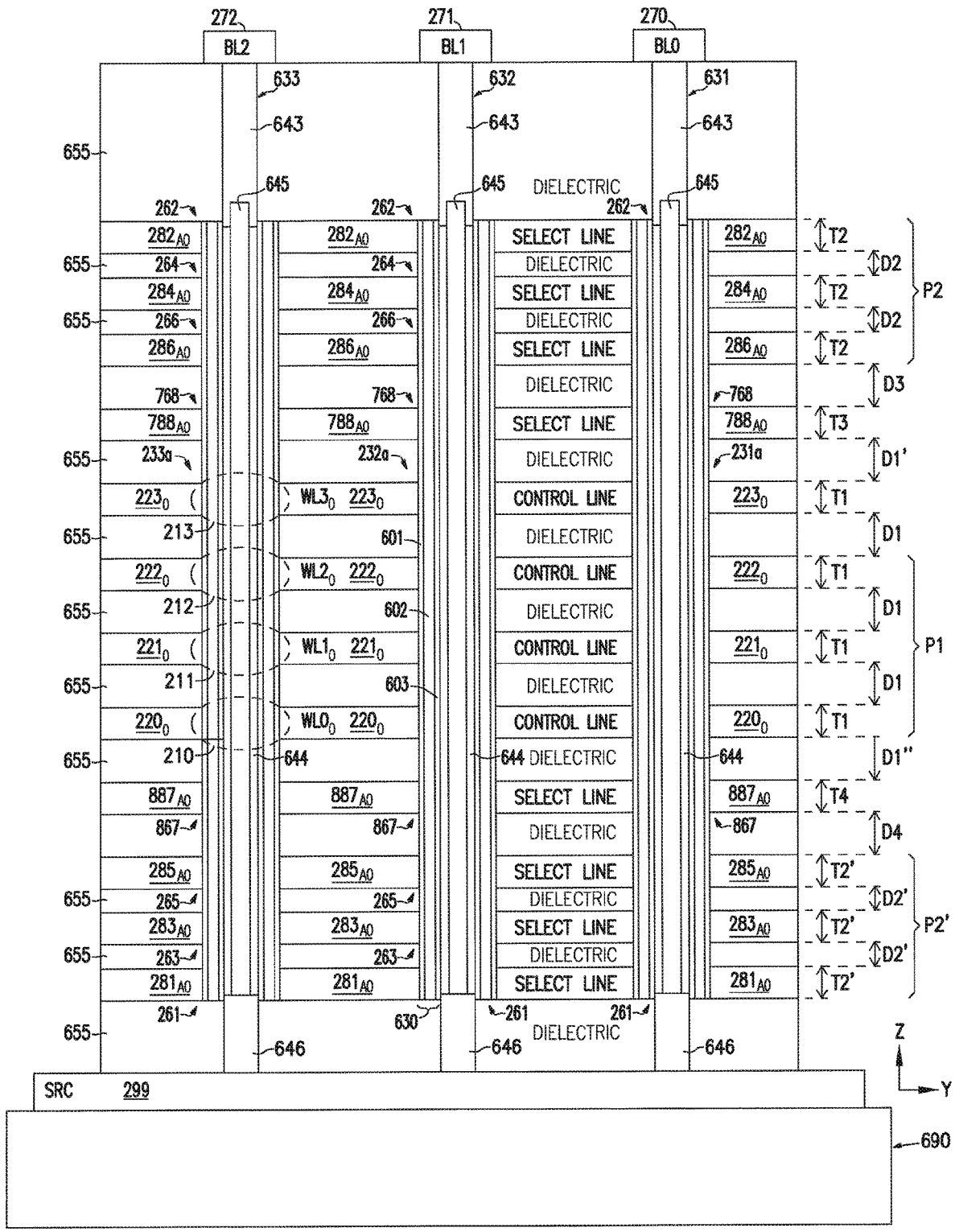
FIG. 9B shows a side view of a structure of a portion of the memory device of FIG. 9A, according to some embodiments described herein.

FIG. 9B shows a side view of a structure of a portion of memory device 900, according to some embodiments described herein. The structure of memory device 900 in FIG. 9B can be a combination of a portion of the structure of memory device 700 (FIG. 7B) and a portion of the structure of memory device 800 (FIG. 8B). For simplicity, the description of similar or identical elements (which have the same labels in FIG. 6, FIG. 7B, FIG. 8B, and FIG. 9B) among memory device 200 (FIG. 6), memory device 700 (FIG. 7B), memory device 800 (FIG. 8B), and memory device 900 is not repeated in the description of FIG. 9B. Memory device 900 (FIG. 9A and FIG. 9B) can include improvements at least similar to those of memory device 200.

Figure 10:
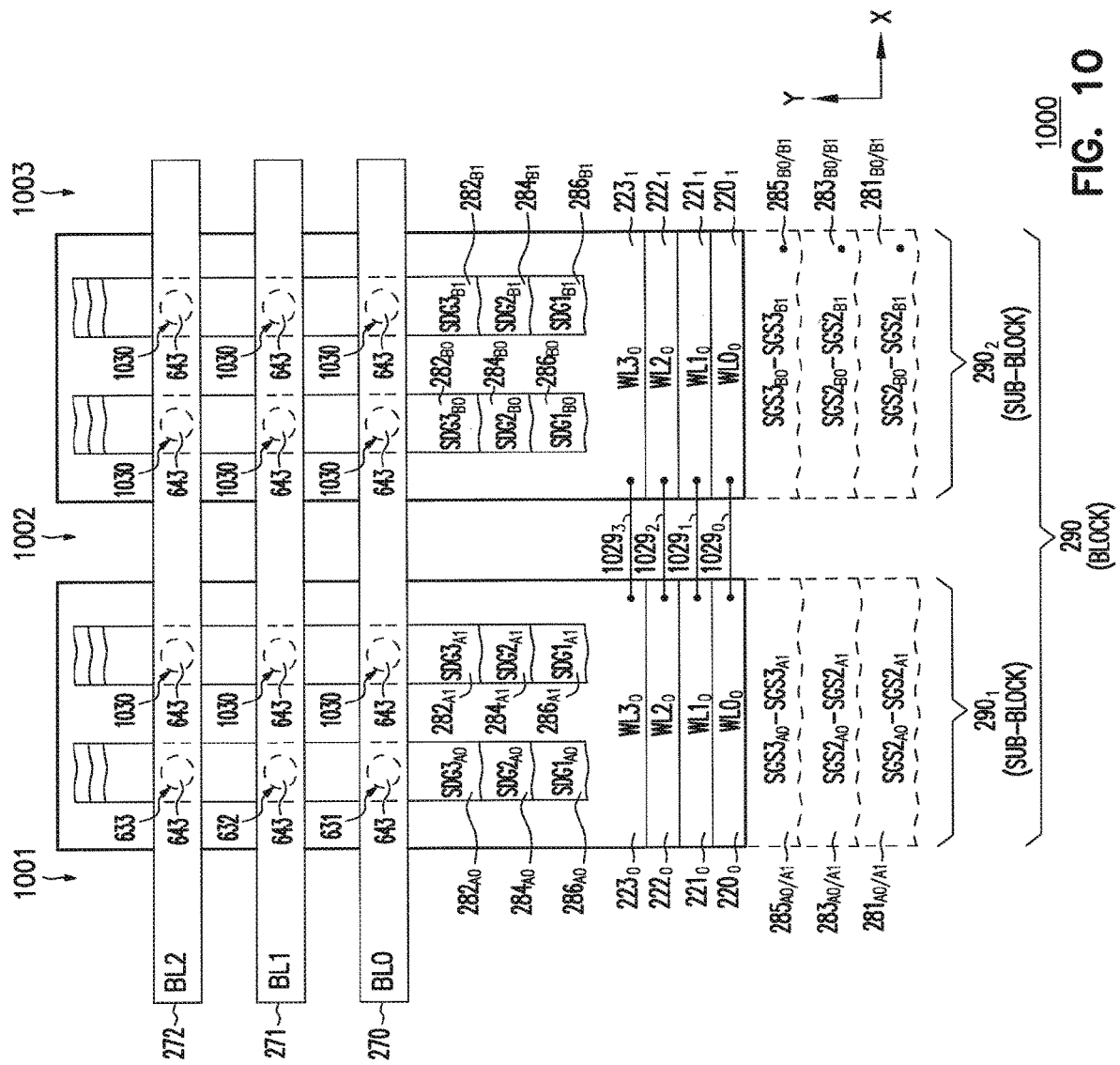
FIG. 10 shows a top view of a structure of a portion of a memory device, according to some embodiments described herein.

FIG. 10 shows a top view of a structure of a portion of a memory device 1000, according to some embodiments described herein. Memory device 1000 can include elements similar to or identical to those of memory device 200 described above with reference to FIG. 2 through FIG. 6. For simplicity, the description of similar or identical elements (which have the same labels in FIG. 6 and FIG. 10) between memory devices 200 and 1000 is not repeated in the description of FIG. 10.

As shown in FIG. 10, memory device 1000 can include slits (e.g., gaps) 1001, 1002, and 1003 between sub-block $290_1$ and $290_2$. Slits 1001, 1002, and 1003 can include dielectric material (e.g., an oxide of silicon) located (filled) in each of slits 1001, 1002, and 1003. Slits 1001, 1002, and 1003 are cuts in the materials (e.g., layers) of memory device 1000 and are formed during processes (e.g., a damascene process) of forming memory device 1000. As shown in FIG. 10, two of slits 1001, 1002, and 1003 can be located immediately on opposing sides (e.g., left and right sides) of the control lines (e.g., $220_0$, $221_0$, $222_0$, and $223_0$) of a sub-block (e.g., sub-block $290_1$).

As shown in a cut-away view in FIG. 10, select line $286_{A0}$ is underneath select line $284_{A0}$, and select line $284_{A0}$ is underneath select line $282_{A0}$. Each of select lines (e.g., drain select lines) $282_{A0}$, $284_{A0}$, and $286_{A0}$ has a length extending in the direction of the y-dimension and a width extending in the direction of the x-dimension. Other drain select lines (e.g., $282_{A1}$, $284_{A1}$, $286_{A1}$, $282_{B0}$, $284_{B0}$, $286_{B0}$, $282_{B1}$, $284_{B1}$, and $286_{B1}$) have similar arrangements to select lines $282_{A0}$, $284_{A0}$, and $286_{A0}$.

As shown in FIG. 10, control line $220_0$ is underneath control line $221_0$, which is underneath control line $222_0$, which is underneath control line $223_0$. Similarly, control line $220_1$ is underneath control line $221_1$, which is underneath control line $222_1$, which is underneath control line $223_1$. Each of control lines $220_0$, $221_0$, $222_0$, $223_0$, $220_1$, $221_3$, $222_1$, and $223_3$ has a length extending in the direction of the y-dimension, and a width extending in the direction of the x-dimension. The width of a particular control line (e.g., $223_0$) is the dimension of that particular control line measured from one slit (e.g., 1001) to another slit (e.g., 1002). Each of control lines $220_0$, $221_0$, $222_0$, and $223_0$ can be coupled to a respective one of control lines $220_1$, $221_1$, $222_1$, and $223_1$ by a respective connection among connections $1029_0$, $1029_1$, $1029_2$, and $1029_3$. As shown in FIG. 10, the width of each of select lines $282_{A0}$, $284_{A0}$, and $286_{A0}$ can be less than the width of each of control lines $220_0$, $221_0$, $222_0$, and $223_0$.

FIG. 10 also shows data lines 270, 271, and 272, pillars 631, 632, and 633 (which are also shown in FIG. 6), and other pillars 1030. Each of data lines 270, 271, and 272 has a length extending in the direction of the x-dimension. Portion 643 of each of pillars 631, 632, 633, and 1030 is coupled to a respective data line among data lines 270, 271, and 272. For example, portion 643 of each of pillars 631, 632, 633 and 1030 can directly contact a conductive material region of a respective data line among data lines 270, 271, and 272.

As shown in FIG. 10, select lines (e.g., source select lines) $281_{A0}$ and $281_{A1}$ (labeled as $281_{A0/A1}$) can be the same select line (e.g., can be formed from the same piece of conductive material). Similarly, select lines $283_{A0}$ and $283_{A1}$ (labeled as $283_{AD/A1}$) can be the same select line; select lines $285_{A0}$ and $285_{A1}$ (labeled as $285_{A0/A1}$) can be the same select line; select lines $281_{B0}$ and $281_{B1}$ (labeled as $281_{B0/B1}$) can be the same select line; select lines $283_{B0}$ and $283_{B1}$ (labeled as $283_{B0/B1}$) can be the same select line; and select lines $285_{B0}$ and $285_{B1}$ (labeled as $285_{B0/B1}$) can be the same select line.

Each of the source select lines (e.g., $281_{A0/A1}$) of memory device 1000 can have a length extending in the direction of the y-dimension, and a width extending in the direction of the x-dimension. The width of the source select lines can be the same as (e.g., substantially equal to) the width of control lines $220_0$, $221_0$, $222_0$, $223_0$, $220_1$, $221_1$, $222_1$, and $223_1$ of memory device 1000.

Figure 11:
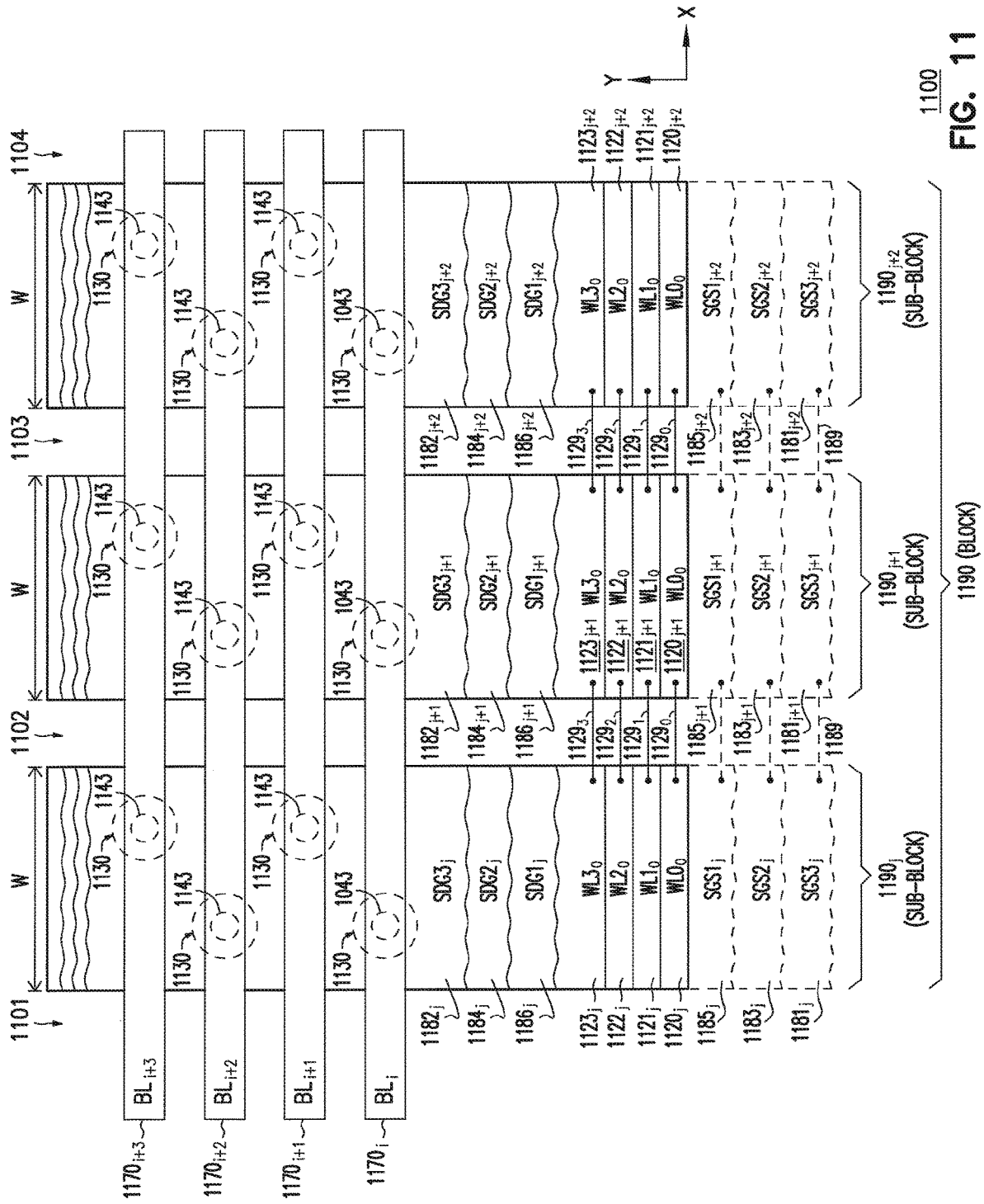
FIG. 11 shows a top view of a structure of a portion of another memory device, according to some embodiments described herein.

FIG. 11 shows a top view of a structure of a portion of a memory device 1100, according to some embodiments described herein. Memory device 1100 can a block (block of memory cells) 1190 having sub-blocks $1190_j$, $1190_{j+1}$, and $1190_{j+2}$. FIG. 11 shows an example where block 1190 includes three sub-blocks. However, block 1190 can include more than three sub-blocks. For example, block 1190 can include a sub-block (or sub-blocks) on the left of sub-block $1190_j$ and a sub-block (or sub-blocks) on the right of sub-block $1190_{j+2}$.

As shown in FIG. 11, memory device 1100 can include slits (e.g., gaps) 1101, 1102, 1103, and 1104 between the sub-blocks of block 1190, such as slit 1102 between sub-blocks $1190_j$ and $1190_{j+1}$, and slit 1103 between sub-blocks $1190_{j+1}$ and $1190_{j+2}$. Slits 1101, 1102, 1103, and 1104 are cuts in the materials (e.g., layers) of memory device 1100 and are formed during processes (e.g., a damascene process) of forming memory device 1100. As shown in FIG. 11, two of slits 1101, 1102, 1103, and 1104 (e.g., 1102 and 1103) can be located immediately on opposing sides (e.g., left and right sides) of a sub-block of memory device 1100.

Memory device 1100 can include data lines $1170_i$, $1170_{i+1}$, $1170_{i+2}$, and $1170_{i+3}$ (collectively called data lines $1170_{(i, i+1, i+2, i, i+3)}$ for simplicity). Data lines $1170_{(i, i+1, i+2, i, i+3)}$ and associated signals $BL_i$, $BL_{i+1}$, $BL_{i+2}$, and $BL_{i+3}$ can be similar to the data lines (e.g., data lines 270, 271, and 272) and their associated signals (e.g., BL0, BL1, and BL2) of memory device 200 (FIG. 2 through FIG. 6). As shown in FIG. 11, each of data lines $1170_{(i, i+1, i+2, i+3)}$ has a length extending in the direction of the y-dimension and is located over other elements of memory device 1100.

Memory device 1100 can include pillars 1130, which can include respective portions (e.g., conductive materials) 1143. Pillars 1130 can correspond to the pillars (e.g., 631, 632, and 633) of memory device 600 of FIG. 6, such that each of pillars 1130 of FIG. 11 can have a length extending in the a direction of the z-dimension (which is perpendicular to the x-dimension and the y-dimension), and such that portions 1143 of pillars 1130 of FIG. 11 can correspond to portions 643 of the pillars of FIG. 6. As shown in FIG. 11, each of pillars 1130 can be located underneath and coupled to a respective data line among data lines $1170_{(i, i+1, i+2, i+3)}$. For example, portion 1143 of each of pillars 1130 can directly contact a conductive material region of a respective data line among data lines $1170_{(i, i+1, i+2, i+3)}$.

Memory device 1100 can include control lines $1120_j$, $1121_j$, $1122_j$, $1123_j$, $1120_{j+1}$, $1121_{j+1}$, $1122_{j+1}$, $1123_{j+1}$, $1120_{j+2}$, $1121_{j+2}$, $1122_{j+2}$, and $1123_{j+2}$, (collectively called control lines $1120/1121/1122/1123_{(j, j+1, j+2)}$ for simplicity). Control lines $1120/1121/1122/1123_{(j, j+1, j+2)}$ and associated signals $WL0_0$, $WL1_0$, $WL2_0$, and $WL3_0$ can be similar to control lines $220_0$, $221_0$, $222_0$, and $223_0$ and their associated signals ($WL0_0$, $WL1_0$, $WL2_0$, and $WL3_0$) of memory device 200 of FIG. 6. Thus, control lines $1120/1121/1122/1123_{(j, j+1, j+2)}$ can be separated from one another by a distance (with respect to the z-dimension) that is similar to or identical to distance D1 of FIG. 6. Each of control lines $1120/1121/1122/1123_{(j, j+1, j+2)}$ can have a thickness (with respect to the z-dimension) that is similar to or identical to thickness T1 of FIG. 6. As shown in FIG. 11, control lines $1120/1121/1122/1123_{(j, j+1, j+2)}$ can be coupled to each other through connections $1129_0$, $1129_1$, $1129_2$, and $1129_3$.

Memory device 1100 can include select lines (e.g., drain select lines) $1182_j$, $1184_j$, $1186_j$, $1182_{j+1}$, $1184_{j+1}$, $1186_{j+1}$, $1182_{j+2}$, $1184_{j+2}$, and $1186_{j+2}$, (collectively called select lines $1182/1184/1186_{(j, j+1, j+2)}$ for simplicity). Select lines $1182/1184/1186_{(j, j+1, j+2)}$ (shown in a cut-away view) are located over the control lines of memory device 1100. Select lines $1182/1184/1186_{(j, j+1, j+2)}$ and associated signals $SGD1_j$, $SGD2_j$, and $SGD3_j$; or $SGD1_{j+1}$, $SGD2_{j+1}$, $SGD3_{j+1}$; or $SGD1_{j+2}$, $SGD2_{j+2}$, and $SGD3_{j+2}$ can be similar to drain select lines $282_{A0}$, $284_{A0}$, and $286_{A0}$ in FIG. 6 (and their associated signals $SGD3_{A0}$, $SGD2_{A0}$, and $SGD1_{A0}$ in FIG. 4) of memory device 200 of FIG. 6. Thus, select lines $1182/1184/1186_{(j, j+1, j+2)}$ can be separated from one another by a distance (with respect to the z-dimension) that is similar to or identical to distance D2 of FIG. 6. Each of select lines $1182/1184/1186_{(j, j+1, j+2)}$ can have a thickness (with respect to the z-dimension) that is similar to or identical to thickness T2 of FIG. 6.

Memory device 1100 can include select lines (e.g., source select lines) $1181_j$, $1183_j$, $1185_j$, $1181_{j+1}$, $1183_{j+1}$, $1185_{j+1}$, $1181_{j+2}$, $1183_{j+2}$, and $1185_{j+2}$, (collectively called select lines $1181/1183/1185_{(j, j+1, j+2)}$ for simplicity). Select lines $1181/1183/1185_{(j, j+1, j+2)}$ (shown in a cut-away view) are illustrated in dashed lines to indicate that they are located underneath control lines $1120/1121/1122/1123_{(j, j+1, j+2)}$. Select lines $1181/1183/1185_{(j, j+1, j+2)}$ and associated signals $SGS1_j$, $SGS2_j$, and $SGS3_j$; or $SGS1_{j+1}$, $SGS2_{j+1}$, $SGS3_{j+1}$; or $SGS1_{j+2}$, $SGS2_{j+2}$, and $SGS3_{j+2}$ can be similar to drain select lines $281_{A0}$, $283_{A0}$, and $285_{A0}$ in FIG. 6 (and their associated signals $SGS3_{A0}$, $SGS2_{A0}$, and $SGS1_{A0}$ in FIG. 4) of memory device 200 of FIG. 6. Thus, select lines $1181/1183/1185_{(j, j+1, j+2)}$ can be separated from one another by a distance (with respect to the z-dimension) that is similar to or identical to distance D2' of FIG. 6. Each of select lines $1181/1183/1185_{(j, j+1, j+2)}$ can have a thickness (with respect to the z-dimension) that is similar to or identical to thickness T2' of FIG. 6. As shown in FIG. 11, select lines $1181/1183/1185_{(j, j+1, j+2)}$ can be coupled to each other through connections 1189.

As shown in FIG. 11, each of control lines $1120/1121/1122/1123_{(j, j+1, j+2)}$ has a length extending in the a width W extending in the direction of the x-dimension. Width W of a particular control line (e.g., $1123_j$) is the entire dimension of that particular control line (e.g., $1123_j$) measured from one slit (e.g., 1101) to another slit (e.g., 1102).

Each of select lines $1182/1184/1186_{(j, j+1, j+2)}$ has a length extending in the direction of the y-dimension, and a width W extending in the direction of the x-dimension. The length of select lines $1182/1184/1186_{(j, j+1, j+2)}$ can be less than the length of control lines $1120/1121/1122/1123_{(j, j+1, j+2)}$. Width W of a particular select line (e.g., drain select line $1182_j$) among select lines $1182/1184/1186_{(j, j+1, j+2)}$ is the entire dimension of that particular select line (e.g., drain select line $1182_j$) measured from one slit (e.g., 1101) to another slit (e.g., 1102).

Each of select lines $1181/1183/1185_{(j, j+1, j+2)}$ has a length extending in the direction of the y-dimension, and a width W extending in the direction of the x-dimension. The length of select lines $1181/1183/1185_{(j, j+1, j+2)}$ can be greater the than the length of control lines $1120/1121/1122/1123_{(j, j+1, j+2)}$. Width W of a particular select line (e.g., source select line $1181_j$) among select lines $1181/1183/1185_{(j, j+1, j+2)}$ is the entire dimension of that particular select line (e.g., source select line $1181_j$) measured from one slit (e.g., 1101) to another slit (e.g., 1102).

Thus, as shown in FIG. 11, in memory device 1100, control lines $1120/1121/1122/1123_{(j, j+1, j+2)}$, select lines $1182/1184/1186_{(j, j+1, j+2)}$, and select lines $1181/1183/1185_{(j, j+1, j+2)}$ can have the same width W.

Further, as shown in FIG. 11, two of slits 1101, 1102, 1103, and 1104 can be located immediately next to opposing sides (e.g., left and right sides) of the control lines, the drain select lines, and the source select lines of a sub-block of memory device 1100. For example, slits 1102 and 1103 (which include dielectric material filled therein) are located immediately next to opposing sides (e.g., left and right sides) of control lines $1120_{j+1}$, $1121_{j+1}$, $1122_{j+1}$, $1123_{j+1}$, select lines $1182_{j+1}$, $1184_{j+1}$, and $1186_{j+1}$, and select lines $1181_{j+1}$, $1183_{j+1}$, and $1185_{j+1}$ of sub-block $1190_{j+1}$.

Figure 12:
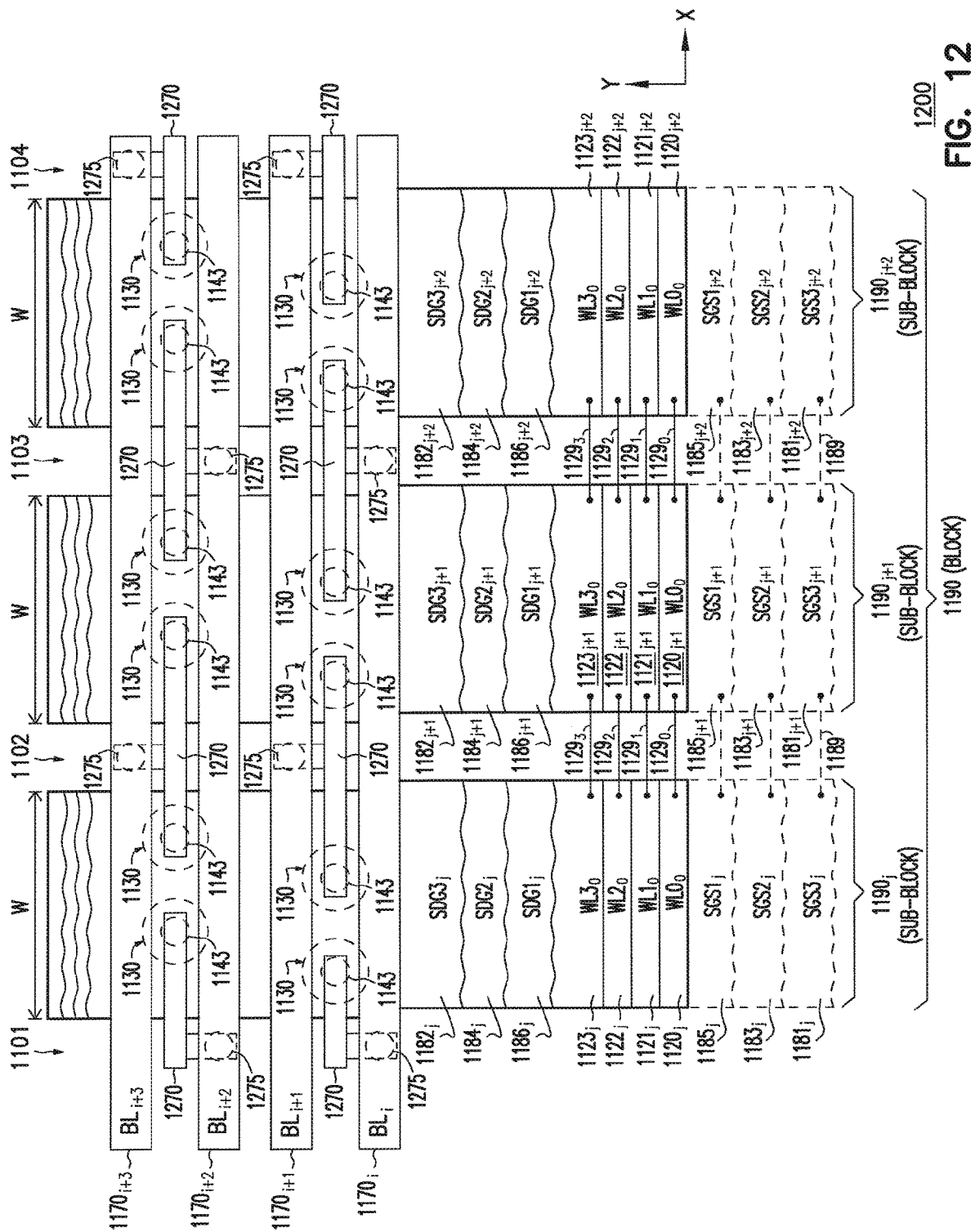
FIG. 12 shows a top view of a structure of a portion of another memory device, according to some embodiments described herein.

FIG. 12 shows a top view of a structure of a portion of a memory device 1200, according to some embodiments described herein. Memory device 1200 can be a variation of memory device 1100. Thus, the structure of memory device 1200 can be similar to the structure of memory device 1100. For simplicity, the description of similar or identical elements (which have the same labels in FIG. 11 and FIG. 12) between memory devices 1100 and 1200 is not repeated in the description of FIG. 12. Differences between memory devices 1100 and 1200 include, as shown in FIG. 12, the arrangement of data lines $1170_{(i, i+1, i+2, i+3)}$ and pillars 1130, and connections between data lines $1170_{(i, i+1, i+2, i+3)}$ and pillars 1130.

As shown in FIG. 12, memory device 1200 can include conductive bridges 1270. Conductive bridges 1270 can be coupled to data lines $1170_{(i, i+1, i+2, i+3)}$ through conductive contacts (e.g., conductive plugs) 1275. Conductive bridges 1270 can be coupled to pillars 1130 through portions 1143. Conductive contacts 1275 can be located at slits 1101, 1102, 1103, and 1104. Each of conductive bridges 1270 can include a piece of conductive material having a length extending in the direction of the x-dimension. Conductive bridges 1270 can be located on a level of memory device 1200 that is above pillars 1130 and below data lines $1170_{(i, i+1, i+2, i+3)}$.

Figure 13:
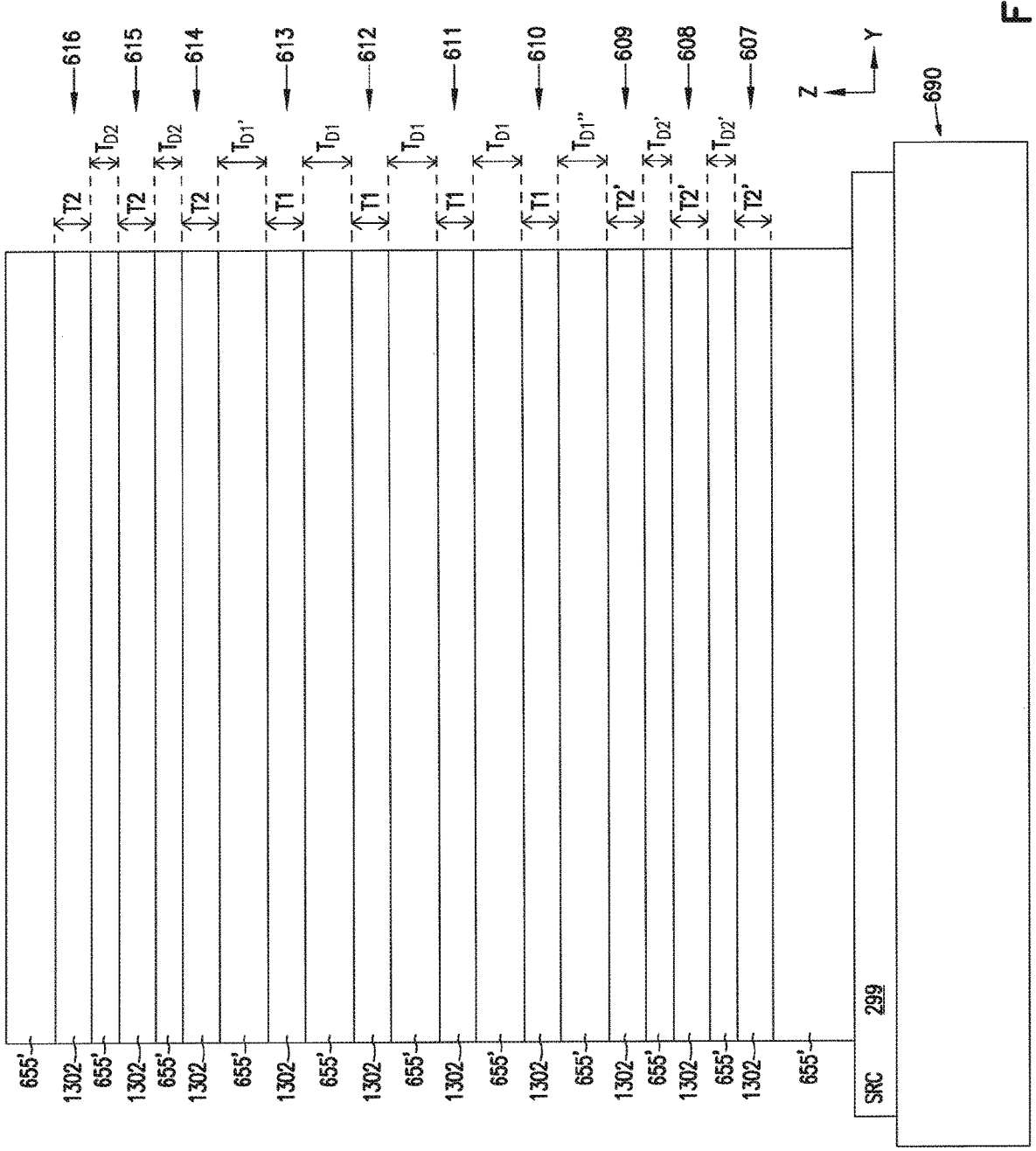
FIG. 13 through FIG. 15 show processes of forming a memory device, according to some embodiments described herein.
Figure 14:
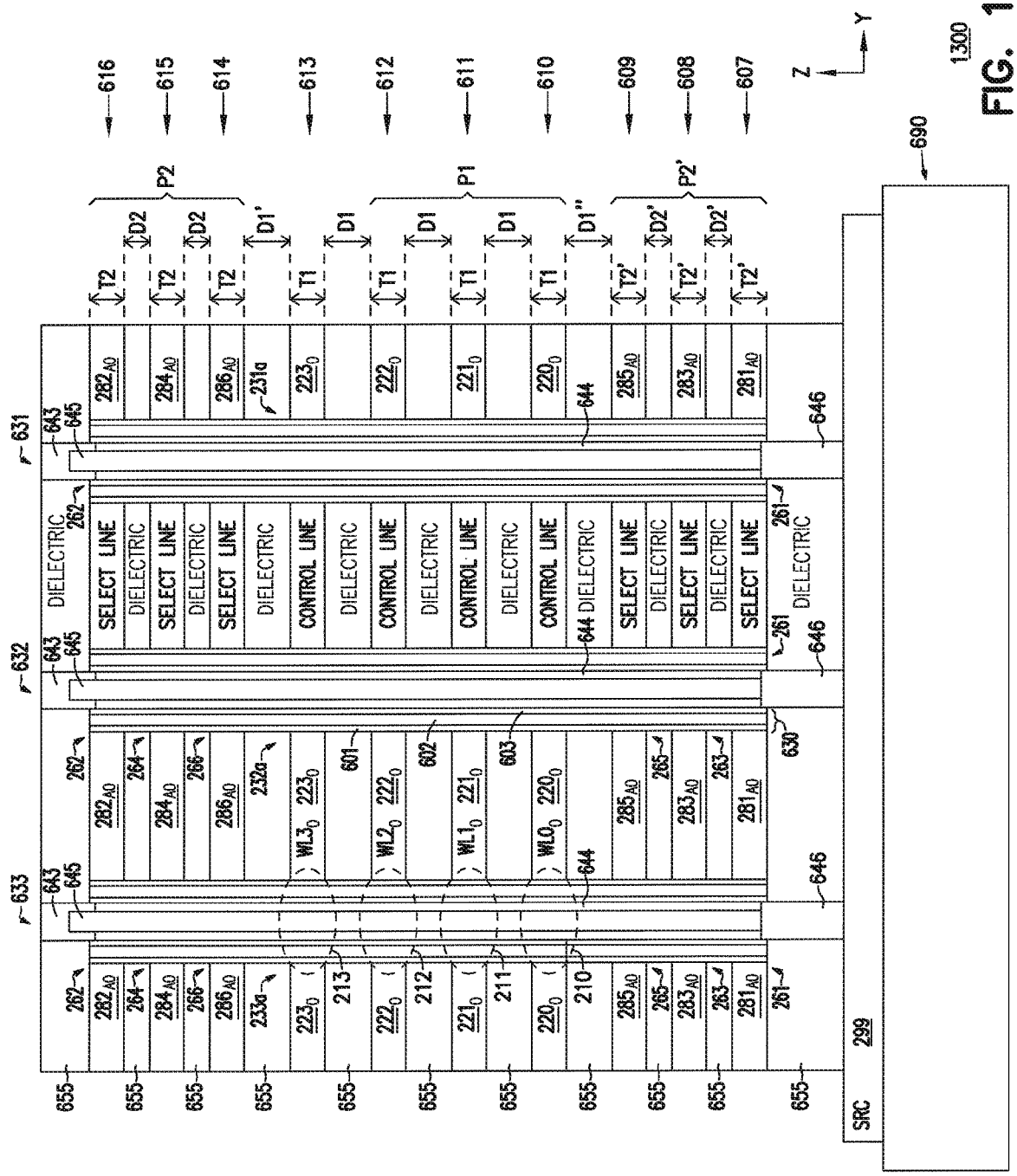
Figure 15:
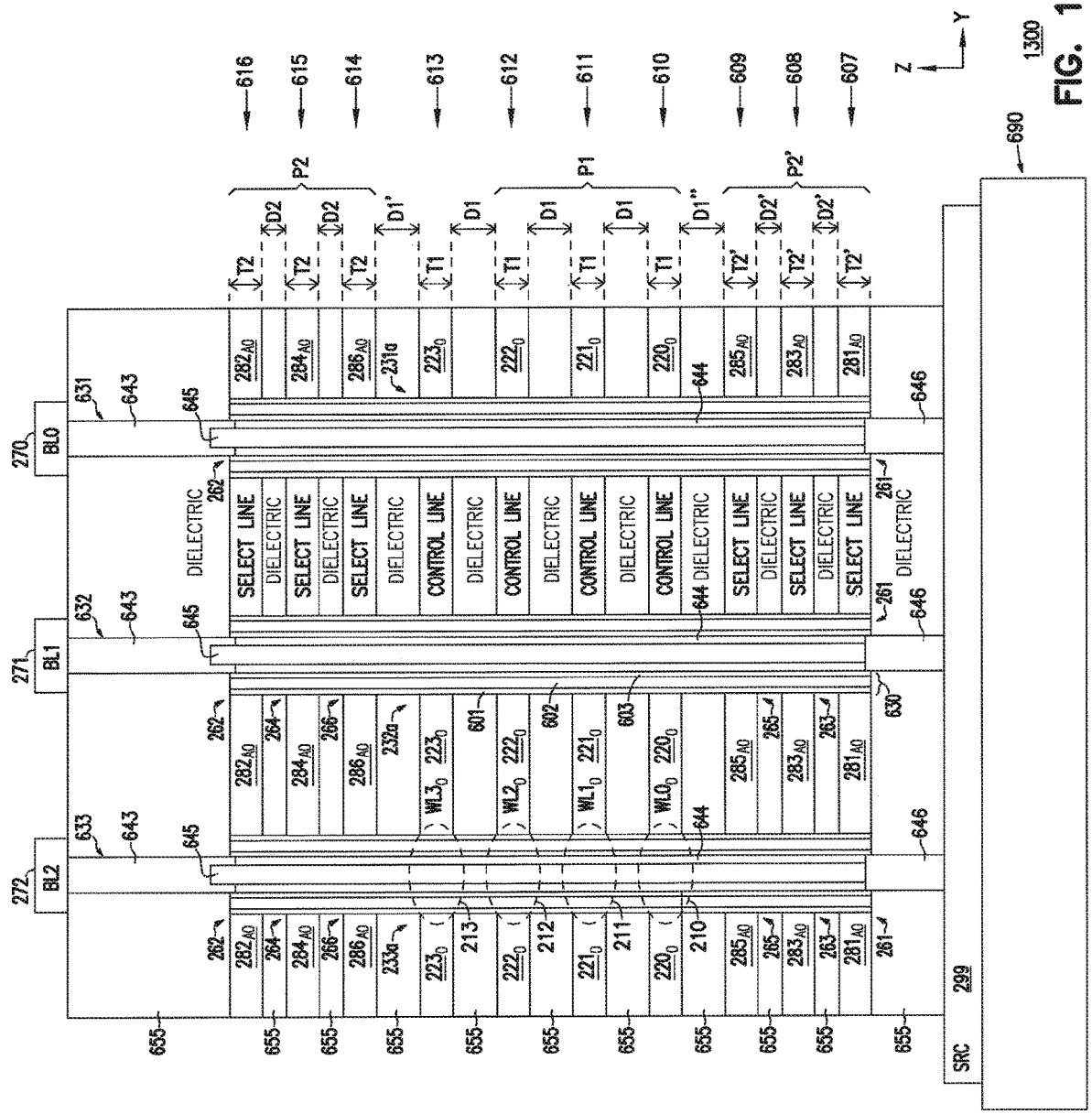

FIG. 13 through FIG. 15 show processes of forming a memory device 1300, according to some embodiments described herein. The processes described with reference to FIG. 13 through FIG. 15 can be used to form memory devices (and their variations) described above with reference to FIG. 1 through FIG. 12. Some of the processes of forming memory device 1300 and some of the elements of memory device 1300 may be readily known to those skilled in the art. Thus, to help focus on the embodiments described herein, some of the processes of forming memory device 1300 shown FIG. 13 through FIG. 15 and additional processes to complete memory device 1300 are omitted. Further, for simplicity, similar or identical elements among the memory devices in FIG. 2 through FIG. 15 are given the same labels.

FIG. 13 shows memory device 1300 after materials 655' and 1302 are formed over line (e.g., source) 299 and substrate 690. Forming materials 655' and 1302 can include depositing alternating dielectric materials (e.g., alternating layers of materials 655' and layers of materials 1302) over line 299 and substrate 690. Materials 655' can include an oxide of silicon (e.g., silicon dioxide $SiO_2$). Materials 1302 can include a combination of silicon and nitrogen (e.g., silicon nitrite $SiNO_4$). Materials 1302 can be formed in each of levels 607 through 616 of memory device 1300 (e.g., each layer of materials 1302 can be formed in a respective level among levels 607 through 616).

As shown in FIG. 13, at each of levels 607 through 616, materials 1302 can be formed to have the thicknesses T1, T2, and T2' that can be the same thickness (e.g., T1=T2=T2'). Some of materials 655' (e.g., some layers of materials 655') can be formed to have different thicknesses, such as thicknesses $T_{D1}$, $T_{D1'}$, $T_{D1''}$, $T_{D2}$, and $T_{D2'}$. Thicknesses $T_{D2}$ and $T_{D2'}$ can be the same (e.g., substantially equal). Each of thicknesses $T_{D2}$ and $T_{D2'}$ can be less than thickness $T_{D1}$.

FIG. 14 shows memory device 1300 after some elements of memory device 1300 are formed. Such memory elements include a portion of each of pillars 631, 632, and 633, memory cell strings 231a, 232a, and 233a, control lines $220_0$, $221_0$, $222_0$, and $223_0$, select lines $282_{A0}$, $284_{A0}$, and $286_{A0}$, select lines $281_{A0}$, $283_{A0}$, and $285_{A0}$, and other elements (as shown in FIG. 14) that can be similar to those of memory device 600 of FIG. 6.

Forming the elements of memory device 1300 in FIG. 14 can include using a process such as a damascene process or other processes. For example, after the materials 655' and 1302 (FIG. 13) are formed, holes (vertical holes, not shown) can be formed in materials 655' and 1302 at the locations of pillars 631, 632, and 633. The holes can be formed by removing parts of materials 655' and 1302 (at the locations of the holes) and leaving a remaining part of materials 655' (which are the materials of dielectrics 655 in FIG. 14 where the holes were not formed) and leaving a remaining part of materials 1302 (where the holes were not formed). The bottoms of the holes can be at line 299. After the holes are formed, memory cell strings 231a, 232a, and 233a (including structures 630) can be formed at the locations of the holes. Other structures (e.g., portions 644, 645, 646, and parts of portions 643) of memory device 1300 can also be formed at the locations of the holes.

After the portions of pillars 631, 632, and 633 are formed, the remaining part of materials 1302 (where the holes were not formed) can be removed (e.g., by etching). Removing materials 1302 can include forming slits (e.g., slits 1101, 1102, 1103, and 1104 in FIG. 11 and FIG. 12) in the remaining part of materials 655' and in the remaining part of materials 1302. Then, material 1302 can be subsequently etched away through the slits, thereby leaving vacancies at the locations on each of levels 607 through 616 where materials 1302 were (before their removal).

After the removal of materials 1302, conductive material (e.g., metal such as tungsten or other conductive materials) may be formed (e.g., filled) in the vacancies (e.g., vacancies on each of levels 607 to 616 in FIG. 14) where materials 1302 were removed. The conductive material on each of levels 607 to 616 in FIG. 14 forms the respective select lines $281_{A0}$, $283_{A0}$, and $285_{A0}$, control lines $220_0$, $221_0$, $222_0$, and $223_0$, and select lines $286_{A0}$, $284_{A0}$, and $282_{A0}$ of memory device 1300 as shown in FIG. 14.

Thus, as described above, select lines $281_{A0}$, $282_{A0}$, $283_{A0}$, $284_{A0}$, $285_{A0}$, and $286_{A0}$ and control lines $220_0$, $221_0$, $222_0$, and $223_0$ can be formed concurrently (formed by the same process step (or steps)). Further, select lines $281_{A0}$, $282_{A0}$, $283_{A0}$, $284_{A0}$, $285_{A0}$, and $286_{A0}$ and control lines $220_0$, $221_0$, $222_0$, and $223_0$ can also be formed from the same conductive material (e.g., metal or other conductive materials).

FIG. 15 shows memory device 1300 after other elements of memory device 1300 are formed. Such elements include additional conductive materials at portions 643 to complete pillars 631, 632, and 633, and other portions of memory device 1300. As shown in FIG. 15, memory device 1300 can include elements that are similar to or identical to the elements of memory device 200 of FIG. 6.

The illustrations of apparatuses (e.g., memory devices 100, 200, 700, 800, 900, 1000, 1100, 1200, and 1300) and methods (e.g., operating methods associated with memory devices 100, 200, 700, 800, 900, 1000, 1100, 1200, and 1300, and methods (e.g., processes) of forming these memory devices) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 700, 800, 900, 1000, 1100, 1200, and 1300) or a system (e.g., a computer, a cellular phone, or other electronic systems) that includes a device such as any of memory devices 100, 200, 700, 800, 900, 1000, 1100, 1200, and 1300.

Any of the components described above with reference to FIG. 1 through FIG. 15 can be implemented in a number of ways, including simulation via software. Thus, apparatuses (e.g., memory devices 100, 200, 700, 800, 900, 1000, 1100, 1200, and 1300 or part of each of these memory devices, including a control unit in these memory devices, such as control unit 118 (FIG. 1)) described above may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 700, 800, 900, 1000, 1100, 1200, and 1300 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 15 include apparatuses, and methods of forming and operating the apparatuses. Some of the apparatuses include a pillar including a length, a memory cell string and control lines located along a first segment of the pillar, and select lines located along a second segment of the pillar. The control lines include at least a first control line and a second control line. The first control line is adjacent the second control line. The first control line is separated from the second control line by a first distance in a direction of the length of the pillar. The select lines include at least a first select line and a second select line. The first select line is separated from the second select line by a second distance in the direction of the length of the pillar. The second distance is less than the first distance. Other embodiments including additional apparatuses and methods are described.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
  a pillar including a first segment, a second segment, and a third segment, the second segment located between the first and third segments;
  a memory cell string and control lines located adjacent the first segment of the pillar;
  a first dielectric between a first control line of the control lines and a second control line of the control lines;
  select lines located adjacent the third segment of the pillar, the select lines being coupled to each other;
  a second dielectric between a first select line of the select lines and a second select line of the select lines, wherein a combination of a thickness of the first select line, a thickness of the second select line, and a thickness of the second dielectric is less than a combination of a thickness of the first control line, a thickness of the second control line, and a thickness of the first dielectric; and
  an additional select line located adjacent the second segment of the pillar, the additional select line being electrically separated from the select lines.

2. The apparatus of claim 1, wherein:
  the first control line is adjacent the second control line and separated from the second control line by a first distance in a direction of the length of the pillar; and
  the first select line is separated from the second select line by a second distance in the direction of the length of the pillar, wherein the second distance is less than the first distance.

3. The apparatus of claim 1, wherein:
  the additional select line is adjacent the first select line and separated from the first select line by a first distance in the direction of the length of the pillar; and
  the first select line is separated from the second select line by a second distance in the direction of the length of the pillar, wherein the second distance is less than the first distance.

4. The apparatus of claim 1, wherein:
  the additional select line is adjacent a control line of the control lines and separated from the control line by a first distance in the direction of the length of the pillar; and
  the first select line is separated from the second select line by a second distance in the direction of the length of the pillar, wherein the second distance is less than the first distance.

5. The apparatus of claim 1, further comprising:
  a first driver circuit coupled to the select lines; and
  a second driver circuit coupled to the additional select line.

6. The apparatus of claim 1, wherein the select lines, the additional select line, and the control lines include a same material.

7. The apparatus of claim 1, wherein the select lines, the additional select line, and the control lines are formed from metal.

8. The apparatus of claim 1, further comprising:
  a data line; and
  a conductive bridge coupled to the pillar and the data line, the conductive bridge and the data line extending in a same direction.

9. The apparatus of claim 1, wherein the control lines and at least one of the additional select line and the select lines have a same thickness.

10. The apparatus of claim 1, wherein each of the select lines and the additional select line has a first width, each of the control lines has a second width, and the first width is less than the second width.

11. The apparatus of claim 1, wherein the select lines, the additional select line, and the control lines have a same width.

12. The apparatus of claim 1, further comprising:
a first slit, and a first dielectric material in the first slit, the first slit located immediately on a first side of the control lines, he select lines, and the additional select line; and
a second slit, and a second dielectric material in the second slit, the second slit located immediately next to a second side opposite from the first side of the control lines, the select lines, and the additional select line.

13. An apparatus comprising:
a data line;
a pillar located under the data line, the pillar including a first segment, a second segment, and a third segment, the second segment located between the first and third segments, the third segment located between the second segment and the data line;
a memory cell string and control lines located adjacent the first segment of the pillar, the control lines including a first control line and a second control line, the first control line adjacent the second control line and separated from the second control line by a first distance in a direction of the length of the pillar;
select lines located adjacent the third segment of the pillar, the select lines being coupled to each other, the select lines including a first select line and a second select line, the first select line separated from the second select line by a second distance in the direction of the length of the pillar, wherein the second distance is less than the first distance; and
an additional select line located adjacent the second segment of the pillar, the additional select line being electrically separated from the select lines.

14. The apparatus of claim 13, wherein the additional select line is adjacent the first select line and separated from the first select line by a third distance, and the second distance is less than the third distance.

15. The apparatus of claim 13, wherein the additional select line is adjacent the first control line and separated from the first control line by a third distance, and the second distance is less than the third distance.

16. The apparatus of claim 13, wherein the pillar includes a conductive material directly contacting the data line.

17. The apparatus of claim 13, further comprising a conductive bridge coupled to the pillar and the data line, the conductive bridge and the data line extending in a same direction.

18. An apparatus comprising:
a substrate;
a pillar extending from the substrate, the pillar including a first segment, a second segment, and a third segment, the second segment located between the first and third segments, and the third segment located between the second segment and the substrate,
a memory cell string and control lines located adjacent the first segment of the pillar;
select lines located adjacent the third segment of the pillar, the select lines being coupled to each other, the select lines including a first select line and a second select line, the first select line separated from the second select line by a first distance in the direction of the length of the pillar; and
an additional select line located adjacent the second segment of the pillar, the additional select line being electrically separated from the select lines, the additional select line is adjacent a control line of the control lines and separated from the control line by a second distance in the direction of the length of the pillar, wherein the second distance is greater than the first distance.

19. The apparatus of claim 18, wherein the additional select line is adjacent the first select line and separated from the first select line by a third distance, and the third distance is greater than the first distance.

20. The apparatus of claim 18, wherein the control lines include an additional control line adjacent the control line and separated from the control line by a third distance in the direction of the length of the pillar, and the third distance is greater than the first distance.

* * * * *